(12) United States Patent
Matsuyama et al.

(10) Patent No.: US 11,756,743 B2
(45) Date of Patent: *Sep. 12, 2023

(54) PHOTOELECTRIC CONVERSION ELEMENT

(71) Applicant: Ricoh Company, Ltd., Tokyo (JP)

(72) Inventors: Tsuyoshi Matsuyama, Shizuoka (JP);
Yuuji Tanaka, Shizuoka (JP); Tamotsu Horiuchi, Shizuoka (JP); Takahiro Ide, Shizuoka (JP); Tokushige Kino, Shizuoka (JP); Shigeyo Suzuki, Shizuoka (JP); Naomichi Kanei, Shizuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/155,628

(22) Filed: Jan. 22, 2021

(65) Prior Publication Data

US 2021/0142957 A1 May 13, 2021

Related U.S. Application Data

(63) Continuation of application No. 16/466,916, filed as application No. PCT/JP2017/042468 on Nov. 27, 2017, now Pat. No. 10,930,443.

(30) Foreign Application Priority Data

Dec. 7, 2016 (JP) .................................. 2016-237980
Dec. 7, 2016 (JP) .................................. 2016-237987

(51) Int. Cl.
  *H01G 9/20* (2006.01)
  *H10K 30/82* (2023.01)
  *H10K 30/83* (2023.01)

(52) U.S. Cl.
  CPC .......... *H01G 9/2059* (2013.01); *H01G 9/204* (2013.01); *H01G 9/2027* (2013.01);
  (Continued)

(58) Field of Classification Search
  CPC .. H01G 9/2059; H01G 9/2027; H01G 9/2031; H01G 9/204; H01L 51/442;
  (Continued)

(56) References Cited

U.S. PATENT DOCUMENTS

2010/0006141 A1* 1/2010 Oikawa ................... B32B 5/024
                                                        136/251
2011/0036393 A1* 2/2011 Chen ..................... H01L 31/046
                                                        136/255
(Continued)

FOREIGN PATENT DOCUMENTS

CN       101232052 A       7/2008
CN       104953031 A       9/2015
(Continued)

OTHER PUBLICATIONS

International Search Report dated Mar. 2, 2018 in PCT/JP2017/042468 filed on Nov. 27, 2017.
(Continued)

*Primary Examiner* — Devina Pillay
(74) *Attorney, Agent, or Firm* — XSENSUS LLP

(57) ABSTRACT

A photoelectric conversion element may include a first substrate, a first transparent electrode disposed on the first substrate, a hole-blocking layer disposed on the first transparent electrode, an electron-transporting layer that is disposed on the hole-blocking layer and includes an electron-transporting semiconductor on a surface of which a photosensitizing compound is adsorbed, a hole-transporting layer that is connected to the electron-transporting layer and includes a hole-transporting material, and a second electrode disposed on the hole-transporting layer, wherein the photoelectric conversion element includes an output extraction terminal part configured to extract electricity out from the photoelectric conversion element, and the output extraction
(Continued)

terminal part is formed with a plurality of micropores piercing through the hole-blocking layer.

18 Claims, 4 Drawing Sheets

(52) U.S. Cl.
CPC ........... *H01G 9/2031* (2013.01); *H10K 30/82* (2023.02); *H10K 30/83* (2023.02)

(58) Field of Classification Search
CPC . H01L 51/445; H01L 51/4226; H01L 27/301; Y02E 10/542; Y02E 10/549
See application file for complete search history.

(56) References Cited

U.S. PATENT DOCUMENTS

| | | | |
|---|---|---|---|
| 2012/0204931 A1 | 8/2012 | Seike | |
| 2013/0026588 A1* | 1/2013 | Kubo | H01L 31/0749 257/431 |
| 2013/0037089 A1* | 2/2013 | Sasaki | H01M 14/005 136/251 |
| 2014/0137945 A1 | 5/2014 | Shibayama et al. | |
| 2015/0279573 A1* | 10/2015 | Horiuchi | H01L 51/4226 136/263 |
| 2017/0162810 A1* | 6/2017 | Aoki | H01L 27/301 |

FOREIGN PATENT DOCUMENTS

| | | |
|---|---|---|
| JP | 2004-103374 A | 4/2004 |
| JP | 2011-119695 A | 6/2011 |
| JP | 2016-051806 A | 4/2016 |
| WO | 2013/018711 A1 | 2/2013 |
| WO | WO 2014/165830 A2 | 10/2014 |
| WO | 2016/031294 A1 | 3/2016 |

OTHER PUBLICATIONS

Written Opinion dated Mar. 2, 2018 in PCT/JP2017/042468 filed on Nov. 27, 2017.
Goto, K. et al., "Heat-resisting Transparent Conductive Oxide Films," Fujikura Technical Journal, No. 106, 2004, pp. 57-61.
Office Action dated Jul. 13, 2021 in Japanese Patent Application No. 2016-237980, 10 pages.
Office Action dated Jul. 13, 2021 in Japanese Patent Application No. 2016-237987, 12 pages.
Office Action dated Aug. 23, 2022 in Chinese Patent Application No. 201780075758.3, 33 pages.

* cited by examiner

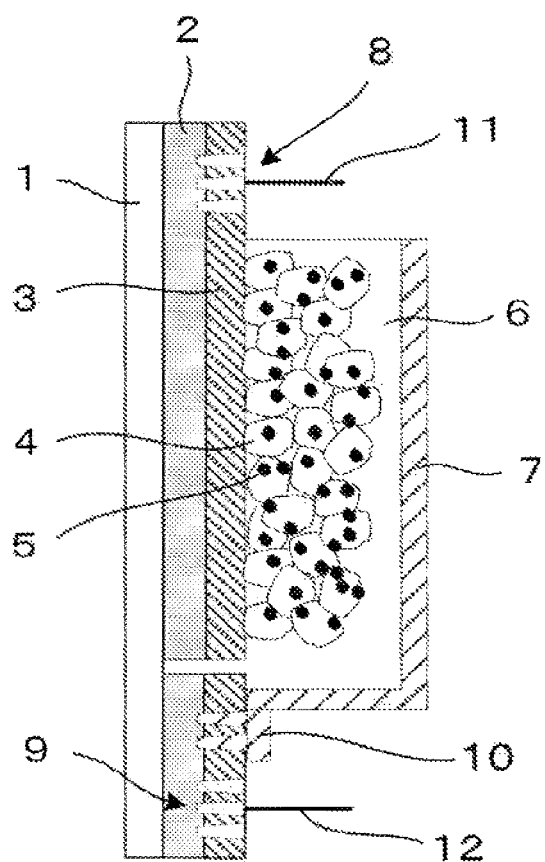

[Fig. 2]
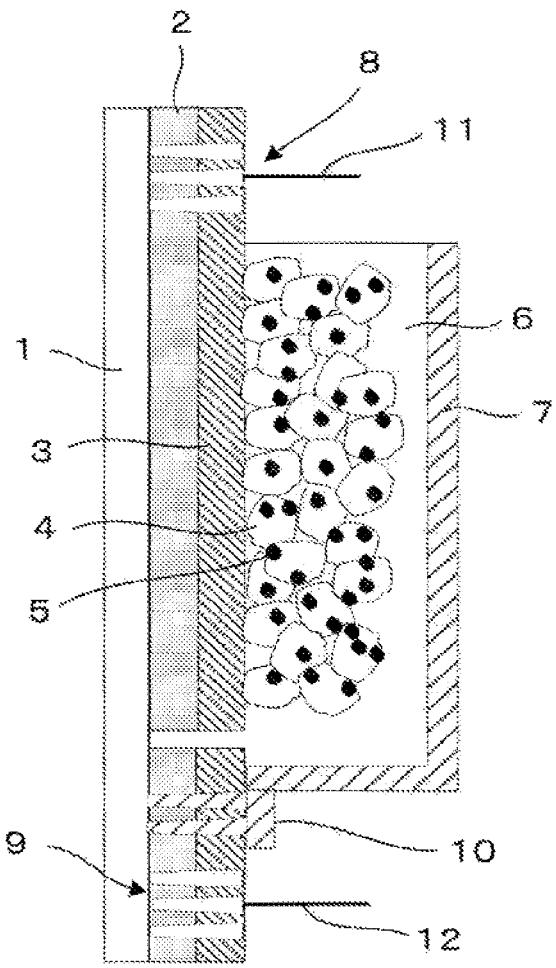
[Fig. 3]
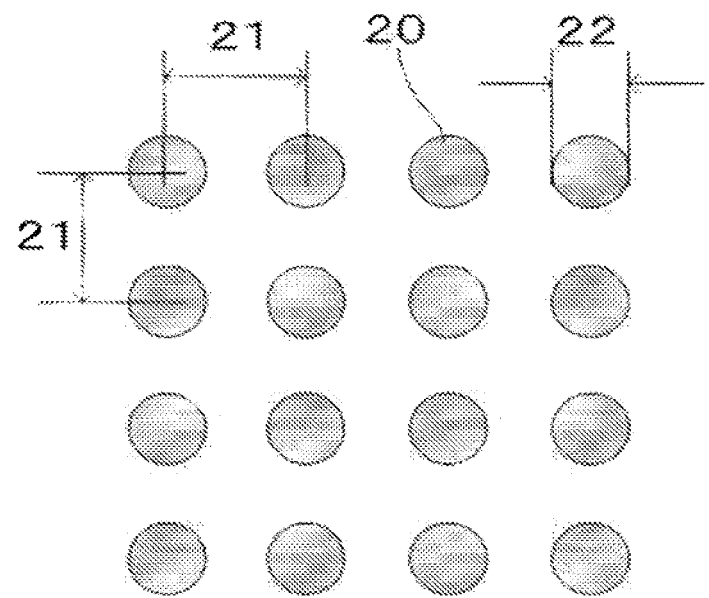

[Fig. 4]
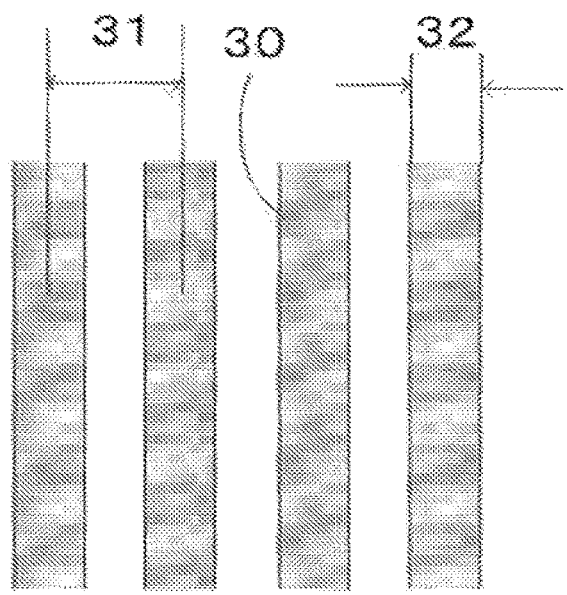
[Fig. 5]
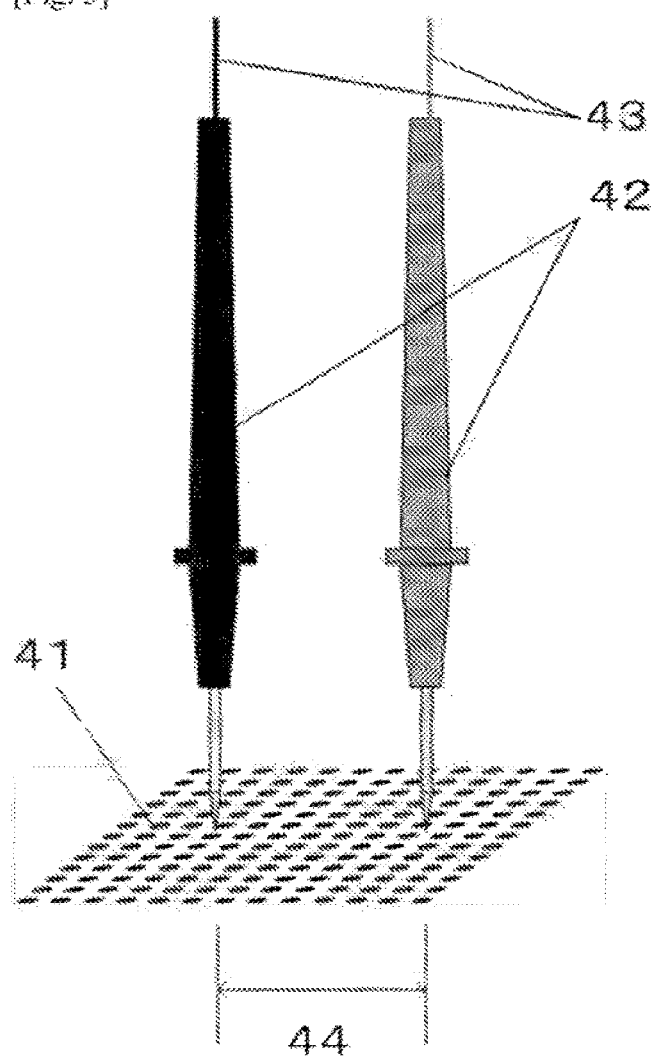

[Fig. 6]
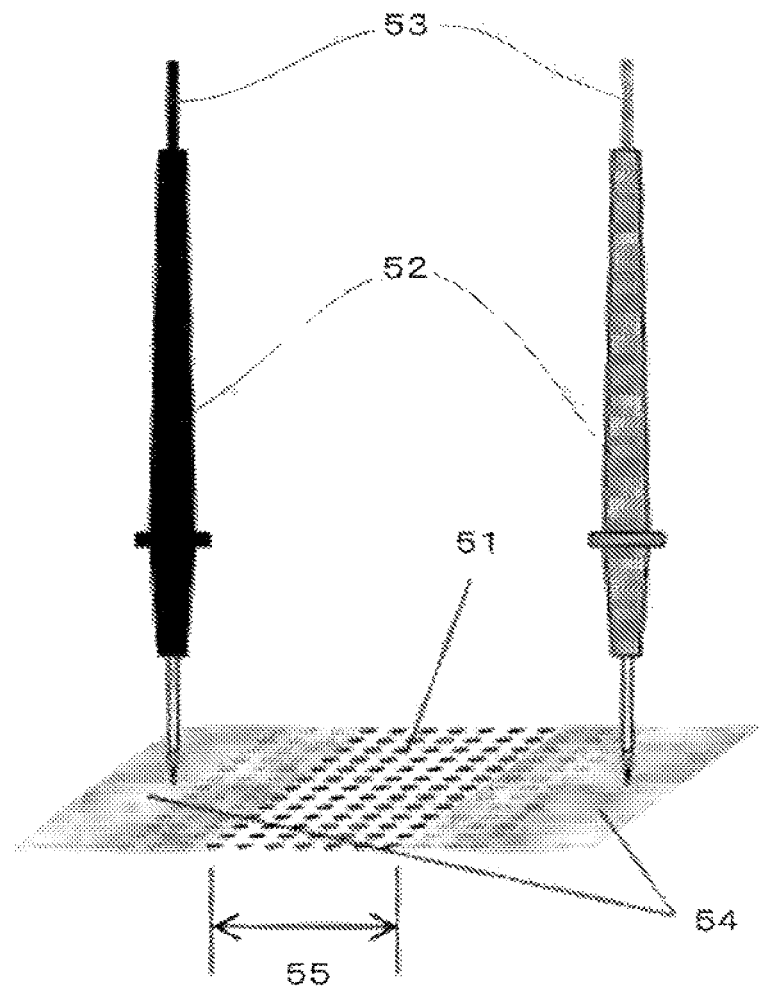
[Fig. 7]
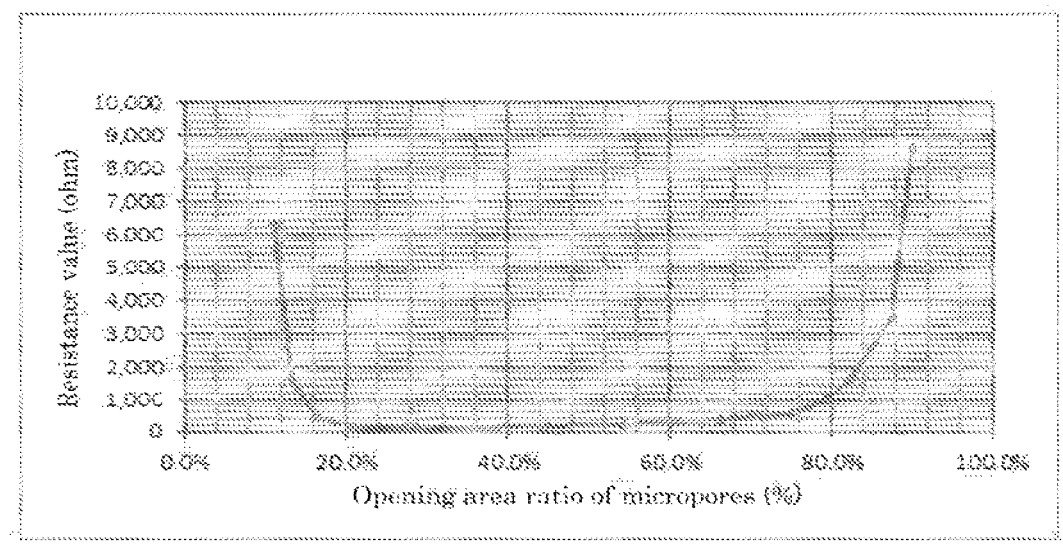

PHOTOELECTRIC CONVERSION ELEMENT

CROSS REFERENCE TO RELATED APPLICATIONS

The present application is a continuation of U.S. application Ser. No. 16/466,916, published as US 2020/0066458 A1, published Feb. 27, 2020, which was the national stage of international application PCT/JP2017/042468, filed on Nov. 27, 2017, and claims the benefit of the filing date of Japanese Applications No. 2016-237980 and 2016-237987, each filed on Dec. 7, 2016, the text of each of which is incorporated by reference.

TECHNICAL FIELD

The present disclosure relates to a photoelectric conversion element.

BACKGROUND ART

In recent years, the power for driving electric circuits has become extremely low, and various electronic parts, such as sensors, have been able to be driven with very low electric power (order of microwatt). As use of sensors, moreover, application of a sensor to an energy-harvesting element as a stand-alone power system capable of generating and consuming power has been expected. Among such energy harvesting elements, solar cells (which are a kind of photoelectric conversion elements) are drawing attention as an element capable of generating power anywhere as long as there is light even if it is very weak light.

Typical examples of very weak light include light emitted from LEDs (light emitting diodes) and light emitted from fluorescent lamps. These types of light is called indoor light because it is mainly used indoor. Illuminance of indoor light is from about 20 Lux to about 1,000 Lux and the indoor light is extremely weak light compared to direct sun light (about 100,000 Lux). As energy-harvesting element, desired is an element capable of efficiently generating power particularly with indoor light from fluorescent lamps or LED lamps.

The photoelectric conversion element typically includes a transparent electrode, an electron-transporting layer, a hole-transporting layer, and a counter electrode. As a material of the transparent electrode, indium tin oxide (referred to as "ITO" hereinafter) that is a material achieving both high transmittance and a low resistance value has been used.

In case of a dye-sensitized solar cell, however, firing is performed, for example, in air for 30 minutes at 500 degrees Celsius, for formation of a porous layer of an electron-transporting semiconductor which is used as an electron-transporting layer of the photoelectric conversion element. When ITO is used as a first transparent electrode in this case, power-generating properties of a solar cell may be deteriorated due to an increase in the resistance value. As a method for avoiding the above-described problem, there is a method where a surface of an ITO electrode is capped with a fluorine-doped tin oxide (referred to as "FTO") or antimony-doped tin oxide (referred to as "ATO") having excellent heat resistance (see, for example, PTL 1 and NPL 1).

Moreover, an increase in a resistance value of an ITO electrode can be suppressed in a firing temperature environment used for formation of a porous layer of an electron-transporting layer, while securing high transmittance, by using a hole-blocking layer disposed between the transparent electrode and the electron-transporting layer in the dye-sensitized solar cell as a cap layer of a surface of the ITO as well as using for an originally intended function of reducing reverse electron transfer (see, for example, PTL 2).

CITATION LIST

Patent Literature

[PTL 1] Japanese Patent No. 4260494
[PTL 2] Japanese Unexamined Patent Application Publication No. 2004-103374

Non-Patent Literature

[NPL 1] Fujikura Technical Journal, No. 106 (2004)57

SUMMARY OF INVENTION

Technical Problem

The present disclosure has an object to provide a photoelectric conversion element capable of extracting output electric power of low electric resistance without lowering photoelectric conversion properties.

Solution to Problem

According to one aspect of the present disclosure, a photoelectric conversion element includes a first substrate, a first transparent electrode disposed on the first substrate, a hole-blocking layer disposed on the first transparent electrode, an electron-transporting layer that is disposed on the hole-blocking layer and includes an electron-transporting semiconductor to a surface of which a photosensitizing compound is adsorbed, a hole-transporting layer that is connected to the electron-transporting layer and includes a hole-transporting material, and a second electrode disposed on the hole-transporting layer. The photoelectric conversion element includes an output extraction terminal part configured to extract electricity out from the photoelectric conversion element, and the output extraction terminal part is formed with a plurality of micropores piercing through the hole-blocking layer.

Advantageous Effects of Invention

The present disclosure can provide a photoelectric conversion element capable of extracting output electric power of low electric resistance without lowering photoelectric conversion properties.

BRIEF DESCRIPTION OF DRAWINGS

FIG. 1 is a schematic view illustrating one example of a photoelectric conversion element of the present disclosure.

FIG. 2 is a schematic view illustrating another example of the photoelectric conversion element of the present disclosure.

FIG. 3 is a conceptual view of a pitch and diameters of circular micropores processed in an output extraction terminal part.

FIG. 4 is a conceptual view of a pitch and widths of linear micropores processed in an output extraction terminal part.

FIG. 5 is a conceptual view of a measurement of a resistance value of an output extraction terminal part according to the 2-terminal method.

FIG. 6 is a conceptual view of a measurement of a resistance value when a conductive material is embedded in micropores of an output extraction part.

FIG. 7 is a correlation view of an opening area rate of micropores of each of Production Examples 101 to 117 and a resistance value of each of Production Examples 101 to 117.

DESCRIPTION OF EMBODIMENTS (Photoelectric Conversion Element)

A photoelectric conversion element of the present disclosure includes a first substrate, a first transparent electrode disposed on the first substrate, a hole-blocking layer disposed on the first transparent electrode, an electron-transporting layer that is disposed on the hole-blocking layer and includes an electron-transporting semiconductor on a surface of which a photosensitizing compound is adsorbed, a hole-transporting layer connected to the electron-transporting layer and including a hole-transporting material, and a second electrode disposed on the hole-transporting layer. The photoelectric conversion element includes an output extraction terminal part configured to extract electricity out from the photoelectric conversion element, and the output extraction terminal part is formed with a plurality of micropores piercing through the hole-blocking layer. The photoelectric conversion element may further include other members, if necessary.

The photoelectric conversion element of the present disclosure has been accomplished based on the following insight. According to a known method for using a hole-blocking layer as a cap layer of a surface of ITO that is a first transparent electrode, an output extraction terminal part of a solar cell is also capped with the hole-blocking layer having a high resistance value. Therefore, the hole-blocking layer on the output extraction terminal part is released to expose the ITO electrode after firing performed for formation of a porous layer of an electron-transporting semiconductor. In the case where the hole-blocking layer is selectively etched only at the output extraction terminal part, using a photoresist etc., however, the resist is applied onto the porous layer of the fired electron-transporting semiconductor or the laminated photoelectric conversion element. Therefore, a resist peeling step and a cleaning step need to be provided. Accordingly, not only that a production process becomes complicated, but also there is a high possibility that deteriorations of the element properties and reduction in yield may be caused.

In the present specification, the term "photoelectric conversion element" means an element which converts optical energy into electric energy, or an element which converts electric energy into optical energy. Specific examples of the photoelectric conversion element include solar cells and photo diodes.

In the photoelectric conversion element of the present disclosure, as an output extraction terminal part, a hole-blocking layer having a function of suppressing an increase in a resistance value of ITO that is a material of a first transparent electrode is finely released by laser processing etc., to expose a first transparent electrode. As a result, output electricity of low electric resistance can be extracted.

In the photoelectric conversion element of the present disclosure, more preferably, an output extraction terminal part and a series cell-connection part can be formed by finely releasing a hole-blocking layer having a function of suppressing an increase in a resistance value of ITO that is a material of a first transparent electrode through simple laser processing etc., to expose the first transparent electrode, without lowering photoelectric conversion properties.

<First Substrate>

The first substrate is not particularly limited and substrates known in the art can be used as the first substrate.

The first substrate is preferably formed of a transparent material. Examples of the first substrate include glass, transparent plastic plates, transparent plastic films, and inorganic transparent crystals.

<First Transparent Electrode>

The first transparent electrode is not particularly limited as long as the first transparent electrode is a transparent conductive material to visible light. As the first transparent electrode, a known transparent electrode used for a typical photoelectric conversion element or liquid crystal panel can be used. Examples of the first transparent electrode include indium tin oxide (ITO), fluorine-doped tin oxide (FTO), antimony-doped tin oxide (ATO), indium zinc oxide, niobium titanium oxide, and graphene. The above-listed examples may be used alone or in combination. Among the above-listed examples, ITO is preferable because both high transmittance and a low electric resistance value can be obtained.

An average thickness of the first transparent electrode is preferably 10 nm or greater but 1,000 micrometers or less in view of high transmittance and low efficiency.

In order to maintain certain hardness, the first transparent electrode is preferably disposed on the first substrate formed of a material transparent to visible light. The first transparent electrode integrated with the first substrate known in the art can be also used. Examples of such a first transparent electrode include ITO coated glass, and ITO coated transparent plastic films.

For the purpose of reducing electric resistance, moreover, a metal lead wire, etc., may be used in combination. Examples of a material of the metal lead wire include metals, such as aluminium, copper, silver, gold, platinum, and nickel. The metal lead wire can be formed by a method where a metal lead wire is disposed on a substrate by vapor deposition, sputtering, crimping, etc., and disposing ITO on the metal lead wire.

<Hole-Blocking Layer>

The hole-blocking layer is disposed in order to suppress a reduction in electricity caused by recombination of holes in an electrolyte and electrons on a surface of an electrode (so-called reverse electron transfer) when the electrolyte is in contact with the electrode. An effect of the hole-blocking layer is particularly significant in a solid dye-sensitized solar cell. This is because the speed of recombination (reverse electron transfer) of holes in a hole-transporting material and electrons on a surface of an electrode is fast in a solid dye-sensitized solar cell using an organic hole-transporting material etc., compared to a wet dye-sensitized solar cell using an electrolyte solution.

A material of the hole-blocking layer is not particularly limited and may be appropriately selected depending on the intended purpose, as long as the material is transparent to visible light and is an electron-transporting material. Examples of the material of the hole-blocking layer include titanium oxide, niobium oxide, magnesium oxide, aluminium oxide, zinc oxide, tungsten oxide, and tin oxide. The above-listed examples may be used alone or in combination.

A film-forming method of the hole-blocking layer is not particularly limited and may be appropriately selected depending on the intended purpose. In order to prevent electric current loss due to room light, high internal resistance is desired and the film-forming method also plays an important role. As the film-forming method, generally, a sol-gel method for forming a film by a wet method is known. However, a density of the resultant film is low and electric current loss cannot be sufficiently prevented with the sol-gel method. Therefore, a more preferable film-forming method is a dry film-forming method, such as sputtering. A density of the resultant film is sufficiently high and electric current loss can be prevented with the dry film-forming method.

An average thickness of the hole-blocking layer is not particularly limited and may be appropriately selected depending on the intended purpose. In view of transmittance and a prevention of reverse electron transfer, the average thickness is preferably 5 nm or greater but 1,000 nm or less. In a wet film-forming, the average thickness is preferably 500 nm or greater but 700 nm or less. In a dry film-forming, the average thickness is preferably 10 nm or greater but 30 nm or less.

<Electron-Transporting Layer>

The electron-transporting layer is disposed on the hole-blocking layer and includes an electron-transporting semiconductor on a surface of which a photosensitizing compound is adsorbed. The electron-transporting layer may be a single layer or a multiple layer.

As the electron-transporting semiconductor, electron-transporting semiconductor particles are preferably used.

In the case where the electron-transport layer is a multilayer, a multilayer of dispersion liquids of semiconductor particles may be applied where each layer includes semiconductor particles of a different particle diameter. Alternatively, a multilayer of coated layers each having different types of a semiconductor, or different compositions of a resin or additives may be applied.

The multilayer coating is an effective method when an average thickness is insufficient with one coating.

Typically, an amount of a born photosensitizing material per unit projected area increases as the average thickness of the electron-transporting layer increases. Therefore, a light capturing rate is high when the average thickness is large. However, the diffusion distance of the injected electrons also increases and therefore loss of electrons is large due to charge recombination. Accordingly, an average thickness of the electron-transporting layer is preferably 10 nm or greater but 10 micrometers or less.

The semiconductor is not particularly limited and may be appropriately selected depending on the intended purpose. Examples of the semiconductor include: single semiconductors, such as silicon and germanium; compound semiconductors, such as chalcogenides of metals; and compounds having the Perovskite structure. The above-listed examples may be used alone or in combination.

Examples of the chalcogenides of metals include: oxides of titanium, tin, zinc, iron, tungsten, zirconium, hafnium, strontium, indium, cerium, yttrium, lanthanum, vanadium, niobium, or tantalum; sulfides of cadmium, zinc, lead, silver, antimony, or bismuth; selenides of cadmium or lead; and telluride of cadmium.

Examples of other compound semiconductors include: phosphides of zinc, gallium, indium, cadmium, etc.; gallium arsenide; copper-indium-selenide; and copper-indium-sulfide.

Examples of the compounds having the Perovskite structure include strontium titanate, calcium titanate, sodium titanate, barium titanate, and potassium niobate.

Among the semiconductors, an oxide semiconductor is preferable, and titanium oxide, zinc oxide, tin oxide, and niobium oxide are more preferable.

A crystal type of the semiconductor particles is not particularly limited and may be appropriately selected depending on the intended purpose. The semiconductor may be monocrystalline, polycrystalline, or amorphous.

A size of the semiconductor particles is not particularly limited and may be appropriately selected depending on the intended purpose. An average particle diameter of primary particles of the semiconductor particles is preferably 1 nm or greater but 100 nm or less, and more preferably 5 nm or greater but 50 nm or less.

Moreover, an efficiency may be improved with an effect of scattering incident light by mixing or laminating semiconductor particles having an average particle diameter larger than the above-mentioned average particle diameter. In this case, an average particle diameter of the semiconductor particles is preferably 50 nm or greater but 500 nm or less.

A production method of the electron-transporting layer is not particularly limited and may be appropriately selected depending on the intended purpose. Examples of the production method include: a method where a thin film is formed in vacuum, such as sputtering; and a wet film-forming method. Among the above-listed examples, in view of production cost etc., a wet film-forming method is preferable, and a method where a paste in which semiconductor particles or a sol is dispersed is prepared and the paste is applied onto an electron collector electrode substrate is particularly preferable.

When the wet film-forming method is used, a coating method is not particularly limited and may be appropriately selected depending on the intended purpose. Examples of the coating method include dip coating, spray coating, wire-bar coating, spin coating, roller coating, blade coating, and gravure coating. Moreover, examples of a wet printing method include relief printing, offset printing, gravure printing, intaglio printing, rubber plate printing, and screen printing.

In the case where a dispersion liquid of the semiconductor particles is produced by mechanical pulverization or using a mill, the dispersion liquid is formed by dispersing at least semiconductor particles alone or a mixture of semiconductor particles and a resin, in water or an organic solvent.

The resin is not particularly limited and may be appropriately selected depending on the intended purpose. Examples of the resin include polymers or copolymers of vinyl compounds (e.g., styrene, vinyl acetate, acrylic acid ester, and methacrylic acid ester), silicone resins, phenoxy resins, polysulfone resins, polyvinyl butyral resins, polyvinyl formal resins, polyester resins, cellulose ester resins, cellulose ether resins, urethane resins, phenol resins, epoxy resins, polycarbonate resins, polyacrylate resins, polyamide resins, and polyimide resins. The above-listed examples may be used alone or in combination.

The solvent is not particularly limited and may be appropriately selected depending on the intended purpose. Examples of the solvent include: water; alcohol-based solvents, such as methanol, ethanol, isopropyl alcohol, and alpha-terpineol; ketone-based solvents, such as acetone, methyl ethyl ketone, and methyl isobutyl ketone; ester-based solvent, such as ethyl formate, ethyl acetate, and n-butyl acetate; ether-based solvents, such as diethyl ether, dimethoxyethane, tetrahydrofuran, dioxolane, and dioxane; amide-based solvents, such as N,N-dimethylformamide, N,N-dimethylacetoamide, and N-methyl-2-pyrrolidone; halogenated hydrocarbon-based solvents, such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon-based solvent, such as n-pentane, n-hexane, n-octane, 1,5-hexadiene, cyclohexane, methyl cyclohexane, cyclohexadiene, benzene, toluene, o-xylene, m-xylene, p-xylene, ethylbenzene, and cumene. The above-listed examples may be used alone or in combination.

An acid (e.g., hydrochloric acid, nitric acid, and acetic acid), a surfactant (e.g., polyoxyethylene(10) octylphenyl ether), or a chelating agent (e.g., acetyl acetone, 2-aminoethanol, and ethylene diamine) may be added to the dispersion liquid of the semiconductor particles, or a paste of the semiconductor particles obtained by a sol-gel method in order to prevent reaggregation of the semiconductor particles.

Moreover, it is also effective to add a thickening agent for improving film-formability.

The thickening agent is not particularly limited and may be appropriately selected depending on the intended purpose. Examples of the thickening agent include: polymers, such as polyethylene glycol and polyvinyl alcohol; and ethyl cellulose.

After a dispersion liquid or paste of the semiconductor particles is applied, the semiconductor particles are electrically brought into contact with each other and preferably subjected to a treatment, such as firing, microwave irradiation, electron beam irradiation, or laser light irradiation, in order to improve a film strength or adhesion to a substrate. The above-listed treatments may be performed alone or in combination.

In the case where the firing is performed, a firing temperature is not particularly limited and may be appropriately selected depending on the intended purpose. When the temperature is too high, however, resistance with a substrate becomes high or the semiconductor particles may be melted. Therefore, the firing temperature is preferably 30 degrees Celsius or higher but 700 degrees Celsius or lower, and more preferably 100 degrees Celsius or higher but 600 degrees Celsius or lower. A firing duration is not particularly limited and may be appropriately selected depending on the intended purpose. The firing duration is preferably 10 minutes or longer but 10 hours or shorter.

In the case where the microwave irradiation is performed, microwaves may be applied from a side of a surface of the photoelectric conversion element at which the electron-transporting layer is formed, or from a side of the back surface. An irradiation duration of the microwaves is not particularly limited and may be appropriately selected depending on the intended purpose, but the microwaves irradiation is preferably performed within 1 hour.

After firing, for example, chemical plating using a mixed solution of an aqueous solution of titanium tetrachloride and an organic solvent, or electrochemical plating using a titanium trichloride aqueous solution may be performed for the purpose of increasing surface areas of the semiconductor particles, or enhancing an electron-injection efficiency from the photosensitizing compound to the semiconductor particles.

A porous state is formed in the film obtained by depositing the semiconductor particles each having a diameter of several tens of nanometers by, for example, firing. The nanoporous structure has an extremely large surface area. The surface area can be expressed by a roughness factor.

The roughness factor is a numerical value representing an actual area inside the pores relative to an area of the semiconductor particles coated on the substrate. Accordingly, the greater roughness factor is more preferable, but the roughness factor is preferably 20 or greater in view of a relationship with a film thickness of the electron-transporting layer.

—Photosensitizing Compound—

In the present disclosure, a photosensitizing compound is preferably adsorbed on a surface of the electron-transporting semiconductor of the electron-transporting layer for the purpose of further improving a conversion efficiency.

The photosensitizing compound is not particularly limited and may be appropriately selected depending on the intended purpose, as long as the photosensitizing compound is a compound that is optically excited by excitation light for use. Examples of the photosensitizing compound include: metal complex compounds disclosed in Japanese Translation of PCT International Application Publication No. JP-T-07-500630 and Japanese Unexamined Patent Application Publication Nos. 10-233238, 2000-26487, 2000-323191, and 2001-59062; coumarin compounds disclosed in Japanese Unexamined Patent Application Publication Nos. 10-93118, 2002-164089, and 2004-95450, and J. Phys. Chem. C, 7224, Vol. 111(2007); polyene compounds disclosed in Japanese Unexamined Patent Application Publication No. 2004-95450 and Chem. Commun., 4887 (2007); indoline compounds disclosed in Japanese Unexamined Patent. Application Publication Nos. 2003-264010, 2004-63274, 2004-115636, 2004-200068, and 2004-235052, and J. Am. Chem. Soc., 12218, Vol. 126 (2004), Chem. Commun., 3036 (2003), and Angew. Chem. Int. Ed., 1923, Vol. 47 (2008); thiophene compounds disclosed in J. Am. Chem. Soc., 16701. Vol. 128 (2006), and J. Am. Chem. Soc., 14256, Vol. 128 (2006); cyanine dyes disclosed in Japanese Unexamined Patent Application Publication Nos. 11-86916, 11-214730, 2000-106224, 2001-76773, and 2003-7359; merocyanine dyes disclosed in Japanese Unexamined Patent Application Publication Nos. 11-214731, 11-238905, 2001-52766, 2001-76775, and 2003-7360; 9-aryl-xanthene compounds disclosed in Japanese Unexamined Patent Application Publication Nos. 10-92477, 11-273754, 11-273755, and 2003-31273; triaryl methane compounds disclosed in Japanese Unexamined Patent Application Publication Nos. 10-93118 and 2003-31273; phthalocyanine compounds disclosed in Japanese Unexamined Patent Application Publication Nos. 09-199744, 10-233238, 11-204821, and 11-265738, J. Phys. Chem., 2342. Vol. 91 (1987), J. Phys. Chem. B, 6272, Vol. 97 (1993), Electroanal. Chem., 31, Vol. 537 (2002), Japanese Unexamined Patent Application Publication No. 2006-032260, J. Porphyrins Phthalocyanines, 230. Vol. 3 (1999). Angew. Chem. Int. Ed., 373, Vol. 46 (2007), and Langmuir, 5436. Vol. 24 (2008); and porphyrin compounds. Among above-listed examples, metal complex compounds, coumarin compounds, polyene compounds, indoline compounds, and thiophene compounds are preferable, and D131 represented by Structural Formula (1) below, D102 represented by Structural Formula (2) below, and D358 represented by Structural Formula (3), all of which are available from MITSUBISHI PAPER MILLS LIMITED, are more preferable.

(D131)
[Chem. 1]

Structural Formula (1)

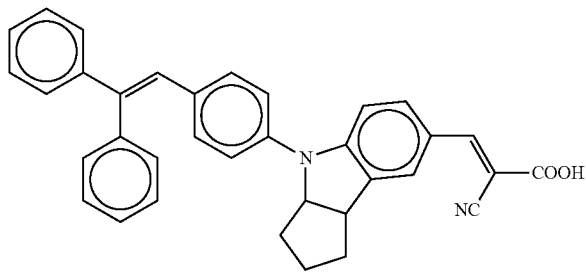

(D102)
[Chem. 2]

Structural Formula (2)

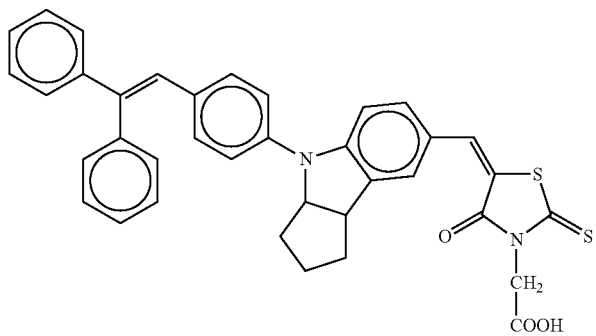

(D358)
[Chem. 3]

Structural Formula (3)

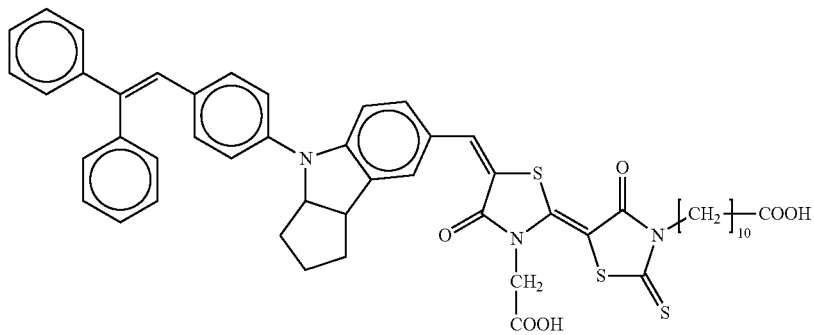

Examples of a method for allowing the photosensitizing compound to be adsorbed onto the electron-transporting semiconductor include: a method where an electron-collector electrode including electron-transporting semiconductor particles is immersed in a solution or dispersion liquid of the photosensitizing compound; and a method where a solution or dispersion liquid of the photosensitizing compound is applied onto an electron-transporting semiconductor to adsorb the photosensitizing compound on the electron-transporting semiconductor.

Examples of the method where an electron-collector electrode including electron-transporting semiconductor particles is immersed in a solution or dispersion liquid of the photosensitizing compound include an immersing method, a dipping method, a roller method, and an air knife method.

Examples of the method where a solution or dispersion liquid of the photosensitizing compound is applied onto an electron-transporting semiconductor to adsorb the photosensitizing compound on the electron-transporting semiconductor include a wire bar method, a slide hopper method, an extrusion method, a curtain method, a spinning method, and a spraying method.

Moreover, the photosensitizing compound may be adsorbed in a supercritical fluid using carbon dioxide etc.

When the photosensitizing compound is made adsorbed, a condensing agent may be used in combination.

The condensing agent may be a substance that exhibits a catalytic function of physically or chemically bonding the photosensitizing compound onto a surface of the electron-transporting semiconductor, or a substance that acts stoichiometrically to cause a chemical equilibrium to move in an advantageous manner.

Moreover, thiol or a hydroxyl compound may be added as a condensing aid.

Examples of a solvent, in which the photosensitizing compound is dissolved or dispersed, include: water, alcohol-based solvents, such as methanol, ethanol, isopropyl alcohol, and alpha-terpineol; ketone-based solvents, such as acetone, methyl ethyl ketone, and methyl isobutyl ketone; ester-based solvent, such as ethyl formate, ethyl acetate, and n-butyl acetate; ether-based solvents, such as diethyl ether, dimethoxyethane, tetrahydrofuran, dioxolane, and dioxane; amide-based solvents, such as N,N-dimethylformamide, N,N-dimethylacetoamide, and N-methyl-2-pyrrolidone; halogenated hydrocarbon-based solvents, such as dichloromethane, chloroform, bromoform, methyl iodide, dichlormethane, trichloroethane, trichloroethylene, chlorobenzene, o-dichlorobenzene, fluorobenzene, bromobenzene, iodobenzene, and 1-chloronaphthalene; and hydrocarbon-based solvent, such as n-pentane, n-hexane, n-octane, 1,5-hexadiene, cyclohexane, methyl cyclohexane, cyclohexadiene, benzene, toluene, o-xylene, m-xylene, p-xylene, ethylbenzene, and cumene. The above-listed examples may be used alone or in combination.

The photosensitizing compound may be used in combination with a disaggregating agent because some of the photosensitizing compounds work more efficiently if aggregations between compounds are prevented, depending on the photosensitizing compound for use.

The aggregate-dissociating agent is not particularly limited and may be appropriately selected depending on a dye for use. Examples of the aggregate-dissociating agent include: a steroid compound such as cholic acid and chenodeoxycholic acid; and long-chain alkyl carboxylic acid or long-chain alkyl phosphonic acid.

An amount of the aggregate-dissociating agent added is preferably 0.01 parts by mass or greater but 500 parts by mass or less, and more preferably 0.1 parts by mass or greater but 100 parts by mass or less, relative to 1 part by mass of the photosensitizing compound.

A temperature at which the photosensitizing compound alone, or a combination of the photosensitizing compound and the disaggregating agent is adsorbed using the above-listed compounds is preferably minus 50 degrees Celsius or higher but 200 degrees Celsius or lower.

Note that, the adsorption may be performed with standing or stirring.

A method for the stirring is not particularly limited and may be appropriately selected depending on the intended purpose. Examples of the method include use of a stirrer, a ball mill, a paint conditioner, a sand mill, an attritor, a disperser, and an ultrasonic disperser.

The time required for the adsorption is preferably 5 seconds or longer but 1,000 hours or shorter, more preferably 10 seconds or longer but 500 hours or shorter, and even more preferably 1 minute or longer but 150 hours or shorter.

Note that, the adsorption is preferably performed in the dark.

<Hole-Transporting Layer>

Examples of a material of the hole-transport layer include electrolytic solutions each obtained by dissolving a redox couple in an organic solvent, gel electrolytes each obtained by impregnating a polymer matrix with a liquid obtained by dissolving a redox couple in an organic solvent, molten salts each including a redox couple, solid electrolytes, inorganic hole-transport materials, and organic hole-transport materials. Among the above-listed examples, an organic hole-transporting material is preferable. Note that, there are descriptions describing the hole-transporting layer using an organic hole-transporting material as an example, but the hole-transporting layer is not limited to the organic hole-transporting material.

The hole-transporting layer may have a single layer structure formed of a single material, or a laminate structure including a plurality of compounds. In the case where the hole-transporting layer has a laminate structure, a polymer material is preferably used for an area of the hole-transporting layer close to the second electrode. Use of a polymer material having excellent film formability can level a surface of a porous electron-transporting layer, and photoelectric conversion characteristic can be improved.

Since the polymer material is unlikely to penetrate into the porous electron, transporting layer, moreover, the polymer material has excellent coatability over a surface of the porous electron-transporting layer, and gives an effect of preventing short-circuits when an electrode is disposed. Accordingly, a higher performance can be obtained.

Examples of an organic hole-transporting material used in the hole-transporting layer having the single layer structure formed of a single material include: oxadiazole compounds disclosed in Japanese Examined Patent Publication No. 34-5466 etc.; triphenylmethane compounds disclosed in Japanese Examined Patent Publication No. 45-555 etc.; pyrazoline compounds disclosed in Japanese Examined Patent Publication No. 52-4188 etc.; hydrazine compounds disclosed in Japanese Examined Patent Publication No. 55-42380 etc.; oxadiazole compounds disclosed in Japanese Unexamined Patent Application Publication No. 56-123544 etc.; tetraarylbenzidine compounds disclosed in Japanese Unexamined Patent Application Publication No. 54-58445; and stilbene compounds disclosed in Japanese Unexamined Patent Application Publication No. 58-65440 or Japanese Unexamined Patent Application Publication No. 60-98437. Among the above-listed examples, a hole-transporting material (2,2',7,7'-tetrakis(N,N-di-p-methoxyphenylamino)-9,9'-spirobifluorene, which may be referred to as [spiro-OMeTAD]) disclosed in Adv. Mater., 813, vol. 17, (2005) is particularly preferable.

The spiro-OMeTAD has a high hole mobility and includes two benzidine skeleton molecules that are bound with each other in a twisted state. Hence, the spiro-OMeTAD forms an electron cloud close to a spherical shape and has a good hopping conductivity between the molecules, leading to a more excellent photoelectric conversion characteristic. The spiro-OMeTAD also has a high solubility, is soluble in various organic solvents, and is amorphous (i.e., an amorphous substance having no crystalline structure). Therefore, the spiro-OMeTAD is likely to be densely filled in the porous electron-transporting layer and has properties useful for a solid dye-sensitized solar cell. Moreover, the spiro-OMeTAD does not have absorb light of 450 nm or greater. Therefore, the spiro-OMeTAD can enable light to be efficiently absorbed into the photosensitizing compound, and has properties useful for a solid dye-sensitized solar cell.

An average thickness of the hole-transporting layer formed of the spiro-OMeTAD is not particularly limited and may be appropriately selected depending on the intended purpose. It is however preferable that the hole-transporting layer has a structure where the hole-transport layer is penetrated into voids of the porous electron-transporting layer. The average thickness of the hole-transporting layer is preferably 0.01 micrometers or greater above the electron-transporting layer, and more preferably 0.1 micrometers or greater but 10 micrometers or less.

Examples of a polymer material used for the hole-transport layer having a laminate structure and disposed at a position close to the second electrode include: polythiophene compounds, such as poly(3-n-hexylthiophene), poly(3-n-octyloxythiophene), poly(9,9'-dioctyl-fluorene-co-bi-thiophene), poly(3,3'''-didodecyl-quarter thiophene), poly(3,6-dioctylthieno[3,2-b]thiophene), poly(2,5-bis(3-decylthiophen-2-yl)thieno[3,2-b]thiophene), poly(3,4-didecylthiophene-co-thieno[3,2-b]thiophene), poly(3,6- dioctylthieno[3,2-b]thiophene-co-thieno[3,2-b]thiophene), poly(3,6-dioctylthieno[3,2-b]thiophene-co-thiophene), and poly(3,6-dioctylthieno[3,2-b]thiophene-co-bithiophene); polyphenylene vinylene compounds, such as poly[2-methoxy-5-(2-ethylhexyloxy)-1,4-phenylenevinylene], poly[2-methoxy-5-(3,7-dimethyloctyloxy)-1,4-phenylenevinylene], and poly[(2-methoxy-5-(2-ethylphexyloxy)-1,4-phenylenevinylene)-co-(4,4'-biphenylene-vinylene)]; polyfluorene compounds, such as poly(9,9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ehylhexyloxy)-1,4-phenylene)], and poly[(9,9-dioctyl-2,7-diyl)-co-(1,4-(2,5-dihexyloxy)benzene)]; polyphenylene compounds, such as poly[2,5-dioctyloxy-1,4-phenylene], and poly[2,5-di(2-ethylhexyloxy-1,4-phenylene]; polyaryl amine compounds, such as poly[(9,9-dioctylfluorenyl-2,7-diyl)-alt-co-(N,N'-diphenyl)-N,N'-di(p-hexylphenyl)-1,4-diaminobenzene], poly[(9,9-dioctylfluorenyl-2,7-diyl)-alt-co-(N,N'-bis(4-octyloxyphenyl)benzidine-N,N'-(1,4-diphenylene)], poly[(N,N'-bis(4-octyloxyphenyl)benzidine-N,N'-(1,4-diphenylene)], poly[(N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylene], poly[p-tolylimino-1,4-phenylenevinylene-2,5-di(2-ethylhexyloxy)-1,4-phenylenevinylene-1,4-phenylene], and poly[4-(2-ethylhexyloxy)phenylimino-1,4-biphenylene]; and polythiadiazole compounds, such as poly[(9,9-dioctylfluorenyl-2,7-diyl)-alt-co-(1,4-benzo(2,1',3)thiadiazole] and poly(3,4-didecylthiophene-co-(1,4-benzo(2,1',3)thiadiazole). The above-listed examples may be used alone or in combination.

Among the above-listed examples, polythiophene compounds and polyaryl amine compounds are preferable in view of carrier mobility and ionization potential.

Additives may be added to the organic hole-transporting material.

The additives are not particularly limited and may be appropriately selected depending on the intended purpose. Examples of the additives include: metal iodides, such as lithium iodide, sodium iodide, potassium iodide, cesium iodide, calcium iodide, copper iodide, iron iodide, and silver iodide; quaternary ammonium salts, such as tetraalkyl ammonium iodide and pyridinium iodide; metal bromides, such as lithium bromide, sodium bromide, potassium bromide, cesium bromide, and calcium bromide; bromine salts of quaternary ammonium compounds, such as tetraalkyl ammonium bromide and pyridinium bromide; metal chlorides, such as copper chloride and silver chloride; metal acetates, such as copper acetate, silver acetate, and palladium acetate; metal sulfates, such as copper sulfate and zinc sulfate; metal complexes, such as ferrocyanate-ferricyanate and ferrocene-ferricinium ion; sulfur compounds, such as polysodium sulfide and alkylthiol-alkyldisulfide; ionic liquids disclosed in Inorg. Chem. 35 (1996) 1168, such as viologen dyes, hydroquinone, etc., 1,2-dimethyl-3-n-propylimidazolinium iodide, 1-methyl-3-n-hexylimidazolinium iodide, 1,2-dimethyl-3-ethylimidazoliumtrifluoromethane sulfonic acid salt, 1-methyl-3-butylimidaoliumnonafluorobutyl sulfonic acid salt, and 1-methyl-3-ethylimidazoliumbis(trifluoromethyl)sulfonylimide; basic compounds, pyridine, 4-t-butylpyridine, and benzimidazole; and lithium compounds, such as lithium trifluoromethane sulfonyl imide, and lithium diisopropyl imide. The above-listed examples may be used alone or in combination.

Among the above-listed example, ionic liquids are preferable, and the ionic liquid being an imidazolium compound is more preferable.

In view of improving conductivity, moreover, an oxidizing agent may be added for changing part of the organic hole-transporting material to a radical cation.

Examples of the oxidizing agent include tris(4-bromophenyl)aluminium hexachloroantimonate, silver hexafluoroantimonate, nitrosonium tetrafluoroborate, silver nitrate, and cobalt complex-based compounds.

There is no need that the entire organic hole-transport material be oxidized by addition of the oxidizing agent, as long as only part of the organic hole-transport material is oxidized. Moreover, the added oxidizing agent may be removed from or not removed from the system after addition.

The hole-transporting layer can be formed directly on the electron-transporting layer including the photosensitizing compound.

A production method of the hole-transporting layer is not particularly limited and may be appropriately selected depending on the intended purpose. Examples of the production method include: a method where a thin film is formed in vacuum, such as vacuum vapor deposition; and a wet film-forming method. Among the above-listed examples, in view of production cost etc., a wet film-forming method is preferable, and a method where a material for the hole-transporting layer is applied onto the electron-transporting layer is preferable.

When the wet film-forming method is used, a coating method is not particularly limited and may be appropriately selected depending on the intended purpose. Examples of the coating method include dip coating, spray coating, wire-bar coating, spin coating, roller coating, blade coating, and gravure coating. Moreover, examples of a wet printing method include relief printing, offset printing, gravure printing, intaglio printing, rubber plate printing, and screen printing. Moreover, a film may be formed in a supercritical fluid or a subcritical fluid of a temperature and pressure lower than a critical point.

The supercritical fluid is not particularly limited and may be appropriately selected depending on the intended purpose, as long as the supercritical fluid exists as a non-cohesive highly dense fluid in a temperature and pressure region exceeding a limit up to which a gas and a fluid can coexist (critical point), does not aggregate when compressed, and a fluid at a critical temperature or higher and critical pressure or higher. The supercritical fluid is preferably a supercritical fluid having a low critical temperature.

The supercritical fluid is not particularly limited and may be appropriately selected depending on the intended purpose. Examples of the supercritical fluid include carbon monoxide, carbon dioxide, ammonia, nitrogen, water, alcohol-based solvents (e.g., methanol, ethanol, and n-butanol), hydrocarbon-based solvents (e.g., ethane, propane, 2,3-dimethylbutane, benzene, and toluene), halogen-based solvents (e.g., methylene chloride and chlorotrifluoromethane), and ether-based solvents (e.g., dimethyl ether). The above-listed examples may be used alone or in combination.

Among the above-listed examples, carbon dioxide is preferable. Since the carbon dioxide has critical pressure of 7.3 MPa and a critical temperature of 31 degrees Celsius, the carbon dioxide is particularly preferable in view of incombustibility and easy handling as well as that a supercritical state of the carbon dioxide can be easily created.

The subcritical fluid is not particularly limited and may be appropriately selected depending on the intended purpose, as long as the subcritical fluid exists as a high-pressure liquid in a temperature and pressure region near a critical point.

The compounds listed as the examples of the supercritical fluid can be also suitably used as the subcritical fluid.

A critical temperature and critical pressure of the supercritical fluid are not particularly limited and may be appropriately selected depending on the intended purpose. The supercritical temperature is preferably minus 273 degrees Celsius or higher but 300 degrees Celsius or lower, more preferably 0 degrees Celsius or higher but 200 degrees Celsius or lower.

In addition to the supercritical fluid and subcritical fluid, moreover, an organic solvent or entrainer can be used in combination. A solubility of the hole-transporting material in a supercritical fluid can be easily adjusted by adding the organic solvent and entrainer.

The organic solvent is not particularly limited and may be appropriately selected depending on the intended purpose. Examples of the organic solvent include: ketone-based solvents, such as acetone, methyl ethyl ketone, and methyl isobutyl ketone; ester-based solvents, such as ethyl formate, ethyl acetate, and n-butyl acetate ether-based solvents, such as diisopropyl ether, dimethoxy ethane, tetrahydrofuran, dioxolane, and dioxane; amide-based solvents, such as N,N-dimethylformamide, N,N-dimethylacetoamide, and N-methyl-2-pyrrolidone; halogenated hydrocarbon-based solvents, such as dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene; and hydrocarbon-based solvents, such as n-pentane, n-hexane, n-octane, 1,5-hexadiene, cyclohexane, methylcyclohexane, cyclohexadiene, benzene, toluene, o-xylene, m-xylene, p-xylene, ethyl benzene, and cumene. The above-listed examples may be used alone or in combination.

A pressing process may be performed in the present disclosure after disposing an organic hole-transporting material on an electron-transporting layer including an electron-transporting material to which a photosensitizing compound has been adsorbed. It is considered that the pressing process makes close adhesion of the organic hole-transporting material with a porous electrode (electron-transporting layer), hence efficiency is improved.

A method for the pressing process is not particularly limited and may be appropriately selected depending on the intended purpose. Examples of the pressing process include press forming using a flat plate, such as an IR tablet molding machine, and roll pressing using a roller.

The pressure applied for the pressing process is preferably 10 kgf/cm or greater, more preferably 30 kgf/cm$^2$ or greater. A duration for the pressing process is not particularly limited and may be appropriately selected depending on the intended purpose, but the pressing process is preferably performed for 1 hour or shorter. Moreover, heat may be applied during the pressing process.

Moreover, a release material may be disposed between a press and an electrode at the time of the pressing process.

A material used for the release material is not particularly limited and may be appropriately selected depending on the intended purpose. Examples of the material include fluororesins, such as polytetrafluoroethylene, polychlorotrifluoroethylene, tetrafluoroethylene-hexafluoropropylene copolymers, perfluoroalkoxy fluoride resins, polyvinylidene fluoride, ethylene-tetrafluoroethylene copolymers, ethylenechlorotrifluoroethylene copolymers, and polyvinyl fluoride. The above-listed examples may be used alone or in combination.

After performing the pressing process, but before disposing a second electrode, a metal oxide may be disposed between the organic hole-transporting material and the second electrode. Examples of the metal oxide include molybdenum oxide, tungsten oxide, vanadium oxide, and nickel oxide. Among above-listed examples, molybdenum oxide is preferable.

A method for disposing the metal oxide on the hole-transporting layer is not particularly limited and may be appropriately selected depending on the intended purpose. Examples of the method include: a method where a thin film is formed in vacuum, such as sputtering and vacuum vapor deposition; and a wet film-forming method. In the wet film-forming method, it is preferable that a paste in which a powder or sol of metal oxide is dispersed be prepared and the powder or sol be applied onto the hole-transporting layer.

When the wet film-forming method is used, a coating method is not particularly limited and may be appropriately selected depending on the intended purpose. Examples of the coating method include dip coating, spray coating, wire-bar coating, spin coating, roller coating, blade coating, and gravure coating. Moreover, examples of a wet printing method include relief printing, offset printing, gravure printing, intaglio printing, rubber plate printing, and screen printing.

An average thickness of the hole-transporting layer is preferably 0.1 nm or greater but 50 nm or less, and more preferably 1 nm or greater but 10 nm or less.

<Second Electrode>

The second electrode can be formed on the hole-transporting layer, or on the metal oxide within the hole-transporting layer.

As the second electrode, an identical electrode to the first transparent electrode can be typically used in a structure where a strength and sealability are sufficiently secured, the second electrode does not always need a support.

Examples of a material of the second electrode include: metals, such as platinum, gold, silver, copper, and aluminium; carbon-based compounds, such as graphite, fullerene, carbon nanotubes, and graphene; conductive metal oxides, such as ITO, FTO, and ATO; and conductive polymers, such as polythiophene and polyaniline.

A film thickness of the second electrode is not particularly limited. Moreover, the above-listed materials may be used alone or in combination.

The second electrode can be formed on the hole-transporting layer by an appropriate method, such as coating, laminating, vapor deposition. CVD, and bonding, depending on a material for use or a type of the hole-transporting layer.

In the present disclosure, the first transparent electrode side of the photoelectric conversion element is transparent, and incident light enters from the side of the first transparent electrode. In this case, a material that reflects light is preferably used at the side of the second electrode. As such a material, glass or a plastic to which metal or conductive oxide is deposited through vapor deposition, or a metal thin film is preferably used. Moreover, it is effective to dispose an anti-reflection layer at the side from which incident light enters.

<Output Extraction Terminal Part>

The output extraction terminal pan is formed with a plurality of micropores formed in the hole-blocking layer and reaching the first transparent electrode. The output extraction terminal part may pierce through the first transparent electrode to reach the first substrate.

Examples of a formation method of the output extraction terminal part include sand blasting, water blasting, using sand paper, chemical etching, and laser processing. Among the above-listed examples, laser processing is preferable. One of reasons why the laser processing is preferable is that fine through holes are easily formed without using sand, an etchant, or a resist, and process can be performed more cleanly and with excellent reproducibility.

—Micropores—

Opening shapes of the micropores are not particularly limited and may be appropriately selected depending on the intended purpose. Examples of the opening shapes include linear shapes, tapered shapes, and circular shapes. Among the above-listed examples, circular shapes are preferable. In this case, a circle means a curved line formed with a collective of points having identical distances from a center. The circle is not necessarily a true circle and includes an oval shape that looks like a pressed true circle.

A minimum opening length of the micropores is not particularly limited and may be appropriately selected depending on the intended purpose. The minimum opening length is preferably 1 micrometer or greater but 400 micrometers or less, and more preferably 5 micrometers or greater but 85 micrometers or less.

An average value (average pitch) of minimum distances of the adjacent micropores is not particularly limited and may be appropriately selected depending on the intended purpose. The average pitch is preferably 5 micrometers or greater but 500 micrometers or less, and more preferably 20 micrometers or greater but 100 micrometers or less.

Openings of the plurality of the micropores are circular shapes. A ratio of an average diameter of the circular micropores to an average pitch of the adjacent circular pores is preferably 25% or greater but 85% or less, and more preferably 40% or greater but 60% or less. The average pitch is more preferably 20 micrometers or greater but 90 micrometers or less.

Opening of the plurality of the micropores are linear shapes. A ratio of an average width of the linear micropores to an average pitch of the adjacent linear micropores is preferably 15% or greater but 45% or less, and more preferably 20% or greater but 25% or less. The average pitch is more preferably 40 micrometers or greater but 100 micrometers or less.

When the output extraction terminal part is formed with a plurality of micropores piercing through the first transparent electrode to reach the first substrate and a total opening area of the micropores becomes too large relative to an area of the output extraction terminal part, a cross-sectional area of a film of the first transparent electrode reduces to increase a resistance value, and as a result, a photoelectric conversion efficiency may be lowered. Accordingly, a ratio of a total opening area of the plurality of micropores to an area of the output extraction terminal part is preferably 5% or greater but 60% or less, and more preferably 15% or greater but 25% or less.

A formation step of the output extraction terminal part may be performed before, during, or after forming an element (forming up to a second electrode). In the present disclosure, the formation step of the output extraction terminal part is preferably performed after forming an element. The reason for the above-described preferable timing is because a substrate is polluted by dusts generated during formation of an output extraction terminal pat, if the formation of the output extraction terminal part is performed before or during forming an element. As a result, connection with an electrode etc., is impaired by the influence of dust because the electrode is formed above the polluted substrate, and therefore a photoelectric conversion efficiency is lowered.

In the present disclosure, at least one of a hole-blocking layer, an electron-transporting layer, a hole-transporting layer, and a second electrode, or in some case, all of the above-listed layers, can be removed by impact peeling through laser processing when the output extraction terminal part is formed by laser processing. This is a second reason whey use of laser processing is preferable in the present disclosure. By using laser processing, it is not necessary to dispose a mask during laminating layers, and removal and formation of a fine output extraction terminal part can be performed at once.

It is preferable that a conductive material film be formed on at least part of the output extraction terminal part to embed a conductive material in the plurality of micropores to perform extraction of output electricity.

The conductive material is not particularly limited as long as the conductive material is a material exhibiting low resistance value properties. Examples of the conductive material include a vapor-deposited metal film having sufficient conductivity and a sufficient film thickness, and a metal paste.

Since the conduct resistance between the test lead pins of the digital multimeter and the exposed ITO area in the micropore can be reduced by embedding the conductive material in the micropores, an excellent resistance value is obtained. To embed the conductive material in the micropores is one of effective methods as a contact aid for the output extraction terminal part with the lead lines.

<Series Cell Connection Part>

The series cell-connection part is a part where the second electrode and the first transparent electrode are connected.

A structure of the series cell-connection part is a structure where a plurality of divided first transparent electrodes and a plurality of divided second transparent electrodes disclosed in Japanese Unexamined Patent Application Publication No. 2014-143333 are alternately connected.

The series cell-connection part is formed with a plurality of micropores formed in the hole-blocking layer and reaching the first transparent electrode. The series cell-connection part may pierce through the first transparent electrode to reach the first substrate.

A formation method of the micropores is identical to the formation method of the micropores in the output extraction terminal part.

In the present disclosure, a total resistance value of the output extraction terminal part and the series cell-connection part is preferably smaller than a series resistance Rs of the photoelectric conversion element.

The series resistance Rs of the photoelectric conversion element is preferably 1 kiloohm or greater but 100 kiloohm or less.

The Rs is series resistance of the photoelectric conversion element and is calculated from an inclination between a plurality of points adjacent to a measurement point Voc at which current is turned from positive to negative. A calculation method is not particularly limited and the Rs can be calculated by a general solar cell evaluation system.

A ratio between a total area of the micropores in the output extraction terminal part and the series cell-connection part and an area of the output extraction terminal part and the series cell-connection part is preferably 16.4% or greater but less than 82.4%.

A structure of the photoelectric conversion element of the present disclosure will be explained with reference to FIGS.

1 and 2. Note that. FIGS. 1 and 2 are each a schematic cross-sectional view illustrating one example of the photoelectric conversion element. In FIG. 1, a plurality of micropores piercing through the hole-blocking layer 3 in the output extraction terminal parts 8 and 9. In FIG. 2, the micropores reach the first substrate 1.

In the embodiments depicted in FIGS. 1 and 2, illustrated are examples of a structure of the photoelectric conversion element including a first substrate 1, a first transparent electrode 2 disposed on the first substrate 1, a hole-blocking layer 3 disposed on the first transparent electrode 2, an electron-transporting layer 4 that is disposed on the hole-blocking layer 3 and includes an electron-transporting semiconductor on a surface of which a photosensitizing compound 5 is adsorbed, a hole-transporting layer 6 that is connected to the electron-transporting layer 4 and includes a hole-transporting material, and a second electrode 7 disposed on the hole-transporting layer 6. Moreover, the first transparent electrode 2 and the second electrode 7 are each individually electrically conducted to lead lines 11 and 12 via corresponding output extraction terminal parts 8 and 9. In a case where a series cell is formed, alternatively, the second electrode 7 is connected to the first transparent electrode of the adjacent photoelectric conversion element to form a series cell-connection part 10.

The series cell-connection part 10 is formed with a plurality of micropores piercing through the hole-blocking layer 3 to reach the first transparent electrode 2. The series cell-connection part 10 may pierce through the first transparent electrode 2 to reach the first substrate 1.

<Use>

The photoelectric conversion element of the present disclosure can be applied to a power supply device when combined with a circuit board configured to control a generated current, etc. Examples of devices utilizing the power supply device include calculators and watches. Other than the examples listed above, a power supply device including the photoelectric conversion element of the present disclosure can be also applied to mobile phones, electronic organizers, electronic paper, etc. Moreover, the power supply device including the photoelectric conversion element of the present disclosure can also be used as an auxiliary power supply intended for extending a continuously usable time of chargeable or dry cell-operated electric appliances.

EXAMPLES

The present disclosure will be described in more detail by way of the following Examples and Comparative Examples. However, the present disclosure should not be construed as being limited to these Examples.

Production Example 1

On an ITO (average film thickness: 300 nm) glass substrate, a dense hole-blocking layer formed of titanium oxide and having an average thickness of 100 nm was formed by reactive sputtering with oxygen gas, using a target formed of metal titanium.

<Formation of Output Extraction Terminal Part with Circular Micropores>

Next, the glass substrate to which titanium oxide had been formed on the ITO was set on a stage operatable along the in-plane direction, and pulsed laser having a laser wavelength (lambda) of 349 nm was vertically applied to the glass substrate on the stage with adjusting the laser to achieve energy per pulse of 8.0 microjoule and a pulse pitch of 50 micrometers. The range of the laser processing was set to 10 mm by 10 mm. The micropores obtained under the above-described conditions had the average diameter of 25.1 micrometers and the average pitch of 50 micrometers as presented in Table 1. A conceptual view of pitches and pore diameters of circular micropores 20 is illustrated in FIG. 3. In FIG. 3, the reference numeral 21 is a pitch of circular micropores 20 and the reference numeral 22 is a diameter of the circular micropore 20.

<Opening Area Ratio>

An opening area ratio of the micropores was determined by measuring diameters and an average pitch of the micropores using an optical microscope and calculating an opening area ratio of the micropores per unit area of the output extraction terminal part.

<Evaluation of Output Extraction Terminal Part>

A resistance value at the obtained output extraction terminal part was measured according to the 2-terminal method. For the measurement of the resistance value, a digital multimeter KU-2608 (test lead 100-50) available from KAISE CORPORATION was used, and the test leads were disposed in a manner that a distance between edges of pins (2 terminals) was to be 5 mm. A conceptual view of a measurement of the resistance value of the output extraction terminal part (a plurality of micropores in the hole-blocking layer) according to the 2-terminal method is illustrated in FIG. 5. In FIG. 5, the reference numeral 41 is an output extraction terminal part (a plurality of micropores in the hole-blocking layer), the reference numeral 42 is a test lead of the 2-terminal method, the reference numeral 43 is a lead line to be connected to the digital multimeter, and the reference numeral 44 is a distance between pin edges of the test leads. As a result of the measurement, excellent resistance value properties, i.e., the resistance value of 14.6 ohm, were obtained.

Production Examples 2 to 7

An output extraction terminal part of each of Production Examples 2 to 7 was formed and a resistance value at the obtained output extraction terminal part was measured in the same manner as in Production Example 1, except that the energy per pulse and the average diameter of the micropores were changed as presented in Table 1. The results are presented in Table 1.

In Production Examples 2 to 7, there were tendencies that the contact resistance increased when the average diameter of the micropores became small relative to the average pitch of the micropores, and electric resistance increased when the average diameter became large because the cross-sectional area of the film of the ITO reduced. In order to obtain a low resistance value at the output extraction terminal part, in case of the average pitch of 50 micrometers, the micropore opening area ratio is preferably 5% or greater but 60% or less, and more preferably 15% or greater but 25% or less. A ratio of the average diameter to the average pitch is preferably 25% or greater but 85% or less and more preferably 40% or greater but 60% or less.

Production Examples 8 to 11

An output extraction terminal part of each of Production Examples 8 to 11 was formed and a resistance value at the obtained output extraction terminal part was measured in the same manner as in Production Example 1, except that the pulse pitch was changed to change the average pitch of the adjacent micropores as presented in Table 1. The results am presented in Table 1.

Similarly to Production Examples 2 to 7, in Production Examples 8 to 11, there were tendencies that the contact resistance increased when the average pitch of the micropores became large relative to the average diameter of the micropores, and the electric resistance increased when the average pitch became small because the cross-sectional area of the film of the ITO reduced. In order to obtain a low resistance value at the output extraction terminal part, in case of the average diameter of about 25 micrometers, it is more preferable that the micropore opening area ratio be about 20% and a ratio of the average diameter to the average pitch be about 50%.

Production Examples 12 to 15

An output extraction terminal part of each of Production Examples 12 to 15 was formed and a resistance value at the obtained output extraction terminal part was measured in the same manner as in Production Example 1, except that the energy per pulse and the pulse pitch were changed to change the average diameter and average pitch of the adjacent micropores, or to give the opening area ratio of the micropores and the ratio of the average diameter to the average pitch, both of which were similar to the values in Production Example 1. The results are presented in Table 1.

In Production Examples 12 to 15, there were tendencies that the contact resistance increased as the average diameter and average pitch became large, even when the micropore opening area ratio was fixed at about 20% and the ratio of the average diameter to the average pitch was fixed at about 50%. Therefore, it is more preferable that the upper limit of the average diameter be 25 micrometers and the upper limit of the average pitch be about 50 micrometers.

Production Examples 16 and 17

An output extraction terminal pan of each of Production Examples 16 and 17 was formed and a resistance value at the obtained output extraction terminal part was measured in the same manner as in Production Example 1, except that the thickness of the ITO film was changed to 8 nm in Production Example 16 and to 1,100 nm in Production Example 17. The results are presented in Table 1.

When the thickness of the ITO film was thin as in Production Example 16, the resistance value increased because the cross-sectional area of the first transparent electrode became small, and properties that the resistance value was 3.8 kiloohm were obtained. When the thickness of the IO film was thick as in Production Example 17, the excellent resistance value that was the resistance value of 12.6 ohm was obtained because the cross-sectional area of the first transparent electrode became large. In view of transmittance, however, the thickness of the ITO film is preferably thinner. Therefore, the thickness of the ITO film is preferably 10 nm or greater but 1,000 nm or less, as described earlier.

Production Examples 18 and 19

An output extraction terminal part of each of Production Examples 18 and 19 was formed and a resistance value at the obtained output extraction terminal part was measured in the same manner as in Production Example 1, except that the average thickness of the dense hole-blocking layer of the titanium oxide was changed to 2.5 nm in Production Example 18 and to 1,100 nm in Production Example 19. The results are presented in Table 1.

In Production Examples 18 and 19, in the case of the hole-blocking layer having the average thickness of 2.5 nm, a low resistance value, i.e., 8.6 ohm, similar to the case with no micropore (see Comparative Production Example 2) was obtained, because the surface layer exhibiting a high resistance value was thin. Even when the average thickness of the hole-blocking layer was thick, moreover, an excellent resistance value, i.e., 19.3 ohm was obtained by forming micropores similar to Production Example 1. In order to realize formation of a uniform film and prevent an increase in a resistance value of the ITO electrode in a firing temperature environment for formation of a porous layer of the electron-transporting layer while securing high transmittance, however, the average thickness of the hole-blocking layer is preferably 5 nm or greater but 1,000 nm or less, as described earlier.

Production Example 20

An output extraction terminal part of Production Example 20 was formed and a resistance value at the obtained output extraction terminal part was measured in the same manner as in Production Example 1, except that a conductive material was embedded in micropores as illustrated in FIG. 6, after forming the micropores with pulsed laser. The result is presented in Table 1.

FIG. 6 is a conceptual view of a measurement of a resistance value when a conductive material is embedded in micropores of an output extraction terminal part. In FIG. 6, the reference numeral 51 is an output extraction terminal part (a plurality of micropores in the hole-blocking layer) the reference numeral 52 is a test lead for the 2-terminal method, the reference numeral 53 is a lead line connected to the digital multimeter, the reference numeral 54 is a conductive material part, and the reference numeral 55 is a distance between the conductive material parts.

In Production Example 20, the conductive material was not particularly limited as long as the conductive material had a low resistance value. Examples of the conductive material include a metal vapor deposition film or metal paste having sufficient conductivity and film thickness. The distance between the conductive material parts was set to 5 mm, and the test lead pins of the digital meter were disposed on the conductive material.

Since the conduct resistance between the test lead pins of the digital multimeter and the exposed ITO area in the micropore could be reduced by embedding the conductive material in the micropores, an excellent resistance value, which was 13.0 ohm, was obtained. To embed the conductive material in the micropores is one of effective methods as a contact aid for the output extraction terminal part with the lead lines.

Production Example 21

A glass substrate to which titanium oxide was formed on an ITO film was produced in the same manner as in Production Example 1.

Next, the glass substrate to which titanium oxide had been formed on the ITO was set on a stage operable along the in-plane direction, and pulsed laser having a laser wavelength (lambda) of 349 nm was vertically applied to the glass substrate on the stage with adjusting the scanning speed to achieve energy per one pulse of 3.5 microjoule in the form of lines. The line pitch was set to 60 micrometers and the range of the laser processing was set to 10 mm by 10 mm. The linear micropores obtained under the above-described conditions had the average width of 15.9 micrometers and the average pitch of 60 micrometers as presented in Table 1. A conceptual view of pitches and diameters of the linear micropores 30 is illustrated in FIG. 4. In FIG. 4, the reference numeral 31 is a pitch of the linear micropores 30 and the reference numeral 32 is a diameter of the linear micropore 30.

<Evaluation of Output Extraction Terminal Part>

An evaluation of the output extraction terminal part was performed by measuring a resistance value in the same manner as in Production Example 1. As a result, an excellent resistance value that was 57.7 ohm was obtained even though the resistance value was not as excellent as the resistance value with the circular micropores of Production Example 1.

Production Examples 22 to 26

An output extraction terminal part of each of Production Examples 22 to 26 was formed and a resistance value at the obtained output extraction terminal part was measured in the same number as in Production Example 21, except that the energy per pulse was changed to change the average width of the linear micropores as presented in Table 1. The results are presented in Table 1.

It could be seen from the results in Table 1 that there were tendencies in Production Examples 22 to 26 that electric resistance increased as the average width of the linear micropores became large relative to the average pitch of the linear micropores because the cross-sectional area of the film of the ITO decreased. In order to obtain a low resistance value at the output extraction terminal part, in case of the average pitch of 60 micrometers, a ratio of the average width of the linear micropores to the average pitch of the linear micropores is preferably 15% or greater but 45% or less and more preferably 20% or greater but 25% or less (the average width of the linear micropores: about 10 micrometers to about 15 micrometers).

Production Examples 27 to 31

An output extraction terminal part of each of Production Examples 27 to 31 was formed and a resistance value at the obtained output extraction terminal part was measured in the same manner as in Production Example 21, except that the pulse pitch was changed to change the average pitch of the adjacent linear micropores as presented in Table 1. The results are presented in Table 1.

Similarly to Production Examples 22 to 26, it could be seen from the results in Table 1 that there were tendencies in Production Examples 27 to 31 that the contact resistance increased when the average pitch of the linear micropores became large relative to the average width of the linear micropores, and the electric resistance increased when the average pitch became small because the cross-sectional area of the film of the ITO decreased. In order to obtain a low resistance value at the output extraction terminal part, in case of the average width of about 15 micrometers, it is more preferable that a ratio of the average width of the linear micropores to the average pitch of the linear micropores be about 25% (average pitch: about 60 micrometers).

Comparative Production Example 1

An output extraction terminal part of Comparative Production Example 1 was formed and a resistance value at the obtained output extraction terminal part was measured in the same manner as in Production Example 1, except that micropores were not formed in the glass substrate to which titanium oxide was formed on the ITO. The results are presented in Table 1.

It could be seen from the result of Table 1 that Comparative Production Example 1 obtained a high resistance value, i.e., 32 kiloohm. The reason for obtaining the high resistance value was because a resistance value of the hole-blocking layer at the outermost surface was high and the test lead pins of the digital multimeters were not in the direct contact with the ITO film that was the first transparent electrode.

Comparative Production Example 2

An output extraction terminal part of Comparative Production Example 2 was formed and a resistance value at the obtained output extraction terminal part was measured in the same manner as in Production Example 1, except that a dense hole-blocking layer was not formed on the ITO glass substrate. The results are presented in Table 1.

It could be seen from the result of Table 1 that Comparative Production Example 2 obtained an extremely low resistance value, i.e., 8.3 ohm. The reason for obtaining the low resistance value was because the test lead pins of the digital multimeter were in the direct contact with the ITO film that was the first transparent electrode, since a hole-blocking layer to be disposed at an outermost surface and having a high resistance value was not formed. In order to suppress an increase in the resistance value of the ITO electrode in a firing temperature environment used for forming a porous layer of an electron-transporting layer, while maintaining high transmittance, as described earlier, it is preferable that the hole-blocking layer be utilized as a cap layer and the hole-blocking layer of the output extraction terminal part be removed by simple laser processing etc. to expose the ITO electrode, after forming a photoelectric conversion element.

Comparative Production Example 3

An output extraction terminal part of Comparative Production Example 3 was formed and a resistance value at the obtained output extraction terminal part was measured in the same manner as in Production Example 1, except that the energy per pulse and the pulse pitch were changed to make the adjacent micropores overlapped with one another (a ratio of the average diameter of the circular micropores to the average pitch of the circular micropore being 100% or greater). The results are presented in Table 1.

It could be seen from the result of Table that in Comparative Production Example 3, the resistance value was extremely large to be in an insulating state. The reason for obtaining the large resistance value was because as well as the hole-blocking layer, the underlying ITO film was removed to lose the conductivity.

TABLE 1

| | Shape of micropores and file constitution | Energy per pulse (μJ) | Average diameter (μm):A | Average width (μm):B | Average pitch (μm):C | Opening area ratio (%) | (A or B)/C (%) | Resistance value (Ω) |
|---|---|---|---|---|---|---|---|---|
| Production Ex. 1 | Circular | 8.0 | 25.1 | — | 50 | 19.8 | 50.2 | 14.6 |
| Production Ex. 2 | Circular | 3.3 | 11.7 | — | 50 | 4.3 | 23.4 | 563 |
| Production Ex. 3 | Circular | 3.5 | 15.9 | — | 50 | 7.9 | 31.8 | 31.3 |
| Production Ex. 4 | Circular | 6.4 | 22.9 | — | 50 | 16.5 | 45.8 | 16.4 |
| Production Ex. 5 | Circular | 10.2 | 28.8 | — | 50 | 26.1 | 57.6 | 17.2 |
| Production Ex. 6 | Circular | 25.8 | 41.1 | — | 50 | 53.1 | 82.2 | 49.0 |
| Production Ex. 7 | Circular | 38.5 | 45.4 | — | 50 | 67.6 | 92.8 | 512 |
| Production Ex. 8 | Circular | 8.0 | 25.1 | — | 30 | 55.0 | 83.7 | 53.2 |
| Production Ex. 9 | Circular | 8.0 | 25.1 | — | 70 | 10.1 | 35.9 | 79.2 |
| Production Ex. 10 | Circular | 8.0 | 25.1 | — | 90 | 6.1 | 27.9 | 129 |
| Production Ex. 11 | Circular | 8.0 | 25.1 | — | 100 | 4.9 | 25.1 | 982 |
| Production Ex. 12 | Circular | 3.5 | 15.9 | — | 30 | 22.0 | 53.0 | 14.5 |
| Production Ex. 13 | Circular | 6.4 | 22.9 | — | 40 | 16.5 | 57.3 | 14.8 |
| Production Ex. 14 | Circular | 10.2 | 28.8 | — | 60 | 18.1 | 48.0 | 37.2 |
| Production Ex. 15 | Circular | 25.8 | 41.1 | — | 80 | 20.7 | 51.4 | 101 |
| Production Ex. 16 | ITO film thickness: 8 nm | 8.0 | 24.8 | — | 50 | 19.2 | 49.6 | 3800 |
| Production Ex. 17 | ITO film thickness: 1.100 nm | 8.0 | 27.1 | — | 50 | 23.1 | 54.2 | 12.6 |
| Production Ex. 18 | Hole-blocking layer thickness: 2.5 nm | 8.0 | 24.7 | — | 50 | 19.2 | 49.4 | 8.6 |
| Production Ex. 19 | Hole-blocking layer thickness: 1.100 nm | 8.0 | 29.3 | — | 50 | 27.0 | 58.6 | 19.3 |
| Production Ex. 20 | Embedding conductive material | 8.0 | 25.1 | — | 50 | 19.8 | 50.2 | 13.0 |
| Production Ex. 21 | Linear | 3.5 | — | 15.9 | 60 | 26.5 | 26.5 | 57.7 |
| Production Ex. 22 | Linear | 3.0 | — | 4.5 | 60 | 7.5 | 7.5 | 624 |
| Production Ex. 23 | Linear | 3.3 | — | 11.7 | 60 | 19.5 | 19.5 | 57.5 |
| Production Ex. 24 | Linear | 6.4 | — | 22.9 | 60 | 39.2 | 38.2 | 105 |
| Production Ex. 25 | Linear | 8.0 | — | 25.1 | 60 | 41.8 | 41.8 | 163 |
| Production Ex. 26 | Linear | 38.5 | — | 46.4 | 60 | 77.3 | 77.3 | 704 |
| Production Ex. 27 | Linear | 3.5 | — | 15.9 | 40 | 39.8 | 39.8 | 129 |
| Production Ex. 28 | Linear | 3.5 | — | 15.9 | 50 | 31.8 | 31.8 | 81.3 |
| Production Ex. 29 | Linear | 3.5 | — | 15.9 | 70 | 22.7 | 22.7 | 104 |
| Production Ex. 30 | Linear | 3.5 | — | 15.9 | 80 | 19.9 | 19.9 | 136 |
| Production Ex. 31 | Linear | 3.5 | — | 15.9 | 120 | 13.3 | 13.3 | 1800 |
| Comparative Production Ex. 1 | No micropore | — | — | — | — | — | — | 32000 |
| Comparative Production Ex. 2 | ITO film only (no formation of hole-blocking layer) | 8.0 | 24.5 | — | 50 | 18.9 | 49.0 | 8.3 |

TABLE 1-continued

| | Shape of micropores and file constitution | Energy per pulse (μJ) | Average diameter (μm):A | Average width (μm):B | Average pitch (μm):C | Opening area ratio (%) | (A or B)/C (%) | Resistance value (Ω) |
|---|---|---|---|---|---|---|---|---|
| Comparative Production Ex. 3 | Entire surface peeling | 25.8 | 41.1 | — | 40 | 100 | 103 | Insulated |

As it was made clear from the descriptions above, the present disclosure could provide a photoelectric conversion element having low electric resistance and capable of excellent extraction of output electricity owing to formation and shapes of a plurality of micropores in a hole-blocking layer.

Production Example 101

On an ITO (average film thickness: 3 nm) glass substrate, a dense hole-blocking layer formed of titanium oxide and having an average thickness of 100 nm was formed by reactive sputtering with oxygen gas, using a target formed of metal titanium.

<Formation of Output Extraction Terminal Part and Series Cell-Connection Part with Circular Micropores>

ITO was set on a stage operable along the in-plane direction, and pulsed laser having a laser wavelength (lambda) of 349 nm was vertically applied to the glass substrate on the stage with adjusting the laser to achieve energy per pulse of 8.0 microjoule and a pulse pitch of 110 micrometers. The range of the laser processing was set to 10 mm by 10 mm. The micropores obtained under the above-described conditions had the average diameter of 41.1 micrometers and the average pitch of 110 micrometers as presented in Table 2.

A conceptual view of pitches and pore diameters of circular micropores 20 is illustrated in FIG. 3. In FIG. 3, the reference numeral 21 is a pitch of circular micropores 20 and the reference numeral 22 is a diameter of the circular micropore 20.

<Opening Area Ratio>

An opening area ratio of the micropores was determined by measuring diameters and an average pitch of the micropores using an optical microscope and calculating an opening area ratio of the micropores per unit area of the output extraction terminal part.

<Evaluations of Output Extraction Terminal Part and Series Cell-Connection Part>

Resistance values of the obtained output extraction terminal part and series cell-connection part were measured according to the 2-terminal method. For the measurement of the resistance value, a digital multimeter KU-2608 (test lead 100-50) available from KAISE CORPORATION was used, and the test leads were disposed in a manner that a distance between edges of pins (2 terminals) was to be 5 mm. A conceptual view of a measurement of the resistance value of the output extraction terminal part (a plurality of micropores in the hole-blocking layer) according to the 2-terminal method is illustrated in FIG. 5. In FIG. 5, the reference numeral 41 is an output extraction terminal part (a plurality of micropores in the hole-blocking layer), the reference numeral 42 is a test lead of the 2-terminal method, the reference numeral 43 is a lead line to be connected to the digital multimeter, and the reference numeral 44 is a distance between pin edges of the test leads. As a result of the measurement, excellent resistance value properties, i.e., the resistance value of 6,294 ohm, were obtained.

Production Examples 102 to 105

An output extraction terminal part and series cell-connection part of each of Production Examples 102 to 105 were formed and a resistance value was measured in the same manner as in Production Example 101, except that the pulse pitch was changed to change the average pitch of the adjacent micropores as presented in Table 2. The results are presented in Table 2.

Production Example 106

A glass substrate to which titanium oxide was formed on ITO was produced in the same manner as in Production Example 101.

Next, the glass substrate to which titanium oxide had been formed on the ITO was set on a stage operable along the in-plane direction, and pulsed laser having a laser wavelength (lambda) of 349 nm was vertically applied to the glass substrate on the stage with adjusting the scanning speed to achieve energy per one pulse of 3.4 microjoule in the form of lines. The line pitch was set to 50 micrometers and the range of the laser processing was set to 10 mm by 10 mm. The linear micropores obtained under the above-described conditions had the average width of 14.4 micrometers and the average pitch of 50 micrometers as presented in Table 2. A conceptual view of pitches and diameters of the linear micropores 30 is illustrated in FIG. 4. In FIG. 4, the reference numeral 31 is a pitch of the linear micropores 30 and the reference numeral 32 is a diameter of the linear micropore 30.

<Evaluations of Output Extraction Terminal Part and Series Cell-Connection Part>

An evaluation of the output extraction terminal part was performed by measuring a resistance value in the same manner as in Production Example 101. As a result, a resistance value that was 81.0 ohm was obtained.

Production Examples 107 to 117

An output extraction terminal part of each of Production Examples 107 to 117 was formed and a resistance value was measured in the same manner as in Production Example 106, except that the energy per pulse was changed to change the average width of the linear micropores as presented in Table 2. The results are presented in Table 2.

In Production Examples 107 to 117, the contact resistance increased when the opening area ratio became small. On the other hand, there were tendencies that the electric resistance increased when the opening area ratio became large because the cross-sectional area of the film of the ITO reduced.

Note that, a correlation view of an opening area rate of micropores of each of Production Examples 101 to 117 and a resistance value of each of Production Examples 101 to 117 is illustrated in FIG. 7.

TABLE 2

| | Shapes of microspores | Average diameter (μm) | Average width (μm) | Average pitch (μm) | Opening area ratio | Resistance value(Ω) |
|---|---|---|---|---|---|---|
| Production Ex. 101 | Circular | 41.1 | — | 110 | 11.0% | 6,294 |
| Production Ex. 102 | Circular | 41.1 | — | 100 | 13.3% | 1,555 |
| Production Ex. 103 | Circular | 41.1 | — | 90 | 16.4% | 432 |
| Production Ex. 104 | Circular | 41.1 | — | 80 | 20.7% | 101 |
| Production Ex. 105 | Circular | 41.1 | — | 70 | 27.1% | 76 |
| Production Ex. 106 | linear | — | 14.4 | 50 | 28.8% | 81 |
| Production Ex. 107 | linear | — | 22.5 | 50 | 45.0% | 163 |
| Production Ex. 108 | linear | — | 27.2 | 50 | 54.4% | 202 |
| Production Ex. 109 | linear | — | 30.6 | 50 | 61.2% | 284 |
| Production Ex. 110 | linear | — | 33.2 | 50 | 66.4% | 357 |
| Production Ex. 111 | linear | — | 35.6 | 50 | 71.2% | 453 |
| Production Ex. 112 | linear | — | 37.5 | 50 | 75.0% | 536 |
| Production Ex. 113 | linear | — | 38.6 | 50 | 77.2% | 744 |
| Production Ex. 114 | linear | — | 39.7 | 50 | 79.4% | 973 |
| Production Ex. 115 | linear | — | 41.2 | 50 | 82.4% | 1,631 |
| Production Ex. 116 | linear | — | 43.7 | 50 | 87.4% | 3,439 |
| Production Ex. 117 | linear | — | 45.0 | 50 | 90.0% | 8,553 |

Example 101

<Production of Titanium Oxide Semiconductor Electrode>

On an ITO (average film thickness: 300 nm glass substrate, a dense hole-blocking layer formed of titanium oxide and having an average thickness of 50 nm was formed by reactive sputtering with oxygen gas, using a target formed of metal titanium Next, 3 g of titanium oxide (P90, available from Nippon Aerosil Co., Ltd.), 0.2 g of acetyl acetone, and 0.3 g of a surfactant (polyoxyethylene octylphenyl ether, available from Wako Pure Chemical Industries, Ltd.) were treated by a bead mill together with 5.5 g of water and 1.0 g of ethanol for 12 hours, to thereby obtain dispersion liquid.

To the obtained dispersion liquid, 1.2 g of polyethylene glycol (#20,000) was added to produce a paste.

The paste was applied onto the hole-blocking layer in a manner that an average thickness of the applied paste was to be 1.5 micrometers. After drying the paste at room temperature, the paste was fired in air for 30 minutes at 500 degrees Celsius, followed by dipping in a 100 mM titanium tetrachloride aqueous solution for 60 minutes at 70 degrees Celsius. Again, the resultant was fired in air for 60 minutes at 450 degrees Celsius to thereby form a porous electron-transporting layer.

<Production of Photoelectric Conversion Element>

Alter immersing the titanium oxide semiconductor electrode in D102, represented by Structural Formula (2) below and available from MITSUBISHI PAPER MILLS LIMITED (0.5 mM, acetonitrile/t-butanol (volume ratio 1:1) solution), the resultant titanium oxide semiconductor electrode was left to stand in the dark for 1 hour to allow the photosensitizing material to be adsorbed on the titanium oxide semiconductor electrode.

A solution was applied onto the titanium oxide semiconductor electrode bearing the photosensitizing compound through spin coating to form a hole-transporting layer (average thickness: 300 nm). The solution was prepared by adding 12.83 mg of lithium bis(trifluoromethane sulfonyl) imide available from KANTO CHEMICAL CO., LTD. and 21.97 mg of 4-pyrrolidinopyridine (PyP) available from Tokyo Chemical Industry Co., Ltd. to 1 mL of a chlorobenzene solution including 183.1 mg of an organic hole-transporting material represented by the following structural formula (name: 2,2',7,7'-tetrakis(N,N-di-p-methoxyphenylamino)-9,9'-spirobifluorene, product number: SHT-263, available from Merck KGaA; CAS No. 207739-72-8).

[Chem. 4]

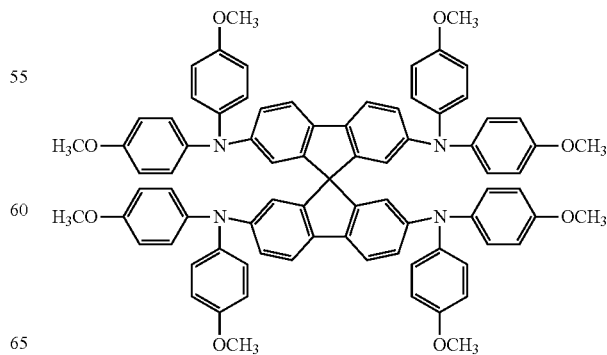

Next, in this state, the formation of micropores of Production Example 105 was performed on an output extraction terminal part and series cell-connection part, followed by depositing silver on the processed hole-transporting layer by 100 nm through vacuum vapor deposition to form a second electrode, to thereby produce a photoelectric conversion element.

Next, an opening area ratio of the obtained photoelectric conversion element (a ratio between a total area of the micropores in the output extraction terminal part and series cell-connection part, and the area of the output extraction terminal part and series cell-connection part) was determined in the same manner as in Production Example 101. Moreover, transmittance to light of 500 nm at an area below an electric-power-generating layer (transmittance of the area of the hole-blocking layer in which micropores were not formed and first transparent electrode to light having a wavelength of 500 nm), and a total resistance value of the micropore-processed regions (a total resistance value of the output extraction terminal part and series cell-connection part) were determined in the methods described below. The results are presented in Table 3-1.

<Transmittance to Light of 500 nm at Area Below Electric-Power-Generating Layer>

The transmittance was measured with a wavelength range of from 300 nm through 600 nm by means of UV-visible spectrophotometer V-660DS available from JASCO Corporation, and the transmittance at 500 nm was recorded.

<Total Resistance Value of Micropore-Processed Regions>

The total resistance value of the micropore-processed regions was calculated based on the resistance value obtained in each Production Example in the following manner.

In Production Example 101 through Production Example 105, the resistance value at the opening area ratio of 27.1% was 76 ohm and the number of the micropore-formed regions was 3 in total, i.e., the output extraction terminal parts (a positive electrode and a negative electrode) and one series-cell-connection because the number of cells in series was 1. The series resistance of the micropore-formed regions given to the photoelectric conversion element was calculated as 76 ohm×3 (regions)=228 ohm.

In Production Example 106 through Production Example 117, moreover, the resistance value at the opening area ratio of 82.4% was 1,567 ohm and the number of the micropore-formed regions was 8 in total. i.e., the output extraction terminal parts (a positive electrode and a negative electrode) and six series-cell-connections because the number of cells in series was 6. Therefore, the series resistance of the micropore-formed regions given to the photoelectric conversion element was calculated as 1567 ohm×8 (regions)=12,536 ohm.

<Evaluation of Photoelectric Conversion Element>

A photoelectric conversion efficiency of the obtained photoelectric conversion element with white LED irradiation (200 Lux and 10,000 Lux) was measured. The measurement was performed by using a high color-rendering LED desk lamp (CDS-90α, available from Cosmotechno. Co., Ltd., study mode) as the white LED and a solar cell evaluation system (As-510-PV03, available from NF CORPORATION) as the evaluator. The results am presented in Tables 3-1 to 3-3.

The photoelectric conversion value Rs in Table 3-3 is series resistance of the photoelectric conversion element and is calculated from an inclination between several points adjacent to a measuring point Voc at which the electric current changes from positive to negative. The calculation method is not particularly limited. The photoelectric conversion value Rs is identical to Rs calculated by a general solar cell evaluation system.

Examples 102 and 103

Photoelectric conversion elements were produced and evaluated in the same manner as in Example 101, except that the micropore processing of Production Example 103 was performed on the output extraction terminal part and series cell-connection part in Example 102 and the micropore processing of Production Example 112 was performed on the output extraction terminal part and series cell-connection part in Example 103. The results are presented in Tables 3-1 to 3-3.

With the opening area ratios of 16.4% and 75.0%, the photoelectric conversion properties of the photoelectric conversion elements had the similar photoelectric conversion properties to Example 101 both in the environment of 200 Lux and the environment of 10,000 Lux.

Example, 104 to 107

Photoelectric conversion elements were produced and evaluated in the same manner as in Example 101, except that the micropore processing of Production Example 105 (in Example 104), Production Example 103 (in Example 105), Production Example 112 (in Example 106), and Production Example 115 (in Example 107) was performed on the output extraction terminal part and series cell-connection part to produce photoelectric conversion elements in each of which 6 cells including a first transparent electrode and a second electrode, both of which were divided into a plurality of electrodes and were disposed on the same substrate, were connected in series (the same structure to FIG. 1 disclosed in Japanese Unexamined Patent Application Publication No. 2014-143333). The results are presented in Tables 3-1 to 3-3.

In Example 104. Rs of the photoelectric conversion element with the opening area ratio 27.1% was larger by 1 digit than Rs of Example 101. It was found that Rs the photoelectric conversion element had varied depending on the number of the cells connected in series.

Since Rs each of the photoelectric conversion elements had increased in Examples 105 to 107, the photoelectric conversion properties of the photoelectric conversion elements with the opening area ratios 16.4%, 75.0%, and 82.4% were similar to Example 104 both in the environment of 200 Lux and the environment of 10000 Lux.

Examples 108 and 109

Photoelectric conversion elements were produced and evaluated in the same manner as in Example 101, except that the average thickness of the hole-blocking layer was changed to 5 nm in Example 108 and to 300 nm in Example 109. The results are presented in Tables 3-1 to 3-3.

When the average thickness of the hole-blocking layer was 5 nm and 300 nm, excellent photoelectric conversion properties were exhibited.

Example 110

A photoelectric conversion element was produced and evaluated in the same manner as in Example 101, except that the hole-blocking layer was changed to niobium oxide. The results are presented in Tables 3-1 to 3-3.

The photoelectric conversion element exhibited excellent photoelectric conversion properties even when the hole-blocking layer was the metal oxide semiconductor material that was different from the porous electron-transporting layer.

Example 111

A photoelectric conversion element was produced and evaluated in the same manner as in Example 101, except that the TO was replaced with FTO. The results are presented in Tables 3-1 to 3-3.

When the ITO was changed to the FTO, the transmittance just below the electric-power-generating layer slightly reduced and Isc reduced to thereby slightly reduce Pmax.

Comparative Examples 101 and 102

Each of photoelectric conversion elements was produced and evaluated in the same manner as in Example 101, except that the micropore processing of Production Example 115 was performed on the output extraction terminal pan and the series cell-connection part in Comparative Example 101 and the micropore processing of Production Example 116 was performed on the output extraction terminal part and the series cell-connection part in Comparative Example 102. The results are presented in Tables 3-1 to 3-3.

In Comparative Example 101, the photoelectric conversion element with the opening area ratio of 82.4% had the similar photoelectric conversion properties to Example 1 in the environment of 200 Lux, but in the environment of 10,000 Lux. Rs increased and the fill factor (FF) decreased to decrease Pmax.

It was found that Rs the photoelectric conversion element had varied depending on the illumination environment, and Rs was greater than the total resistance value of the micropore-processed regions when the total resistance value of the micropore-processed regions calculated by the resistance value of the micropore-processed region multiplied by the number of the processed regions exceeded Rs the photoelectric conversion element had.

In Comparative Example 102, moreover, the total resistance value of the micropore-processed regions was greater than Rs originated the photoelectric conversion element had even in the environment of 200 Lux, Rs increased, and the fill factor (FF) decreased to reduce Pmax, when the opening area ratio was 87.4%.

Comparative Example 103

A photoelectric conversion element was produced and evaluated in the same manner as in Example 104, except that the micropore processing was changed to the micropore processing of Production Example 116. The results are presented in Tables 3-1 to 3-3.

In Comparative Example 103, the photoelectric conversion element with the opening area ratio of 87.4% had the similar photoelectric conversion element to Example 104 in the environment of 200 Lux, but in the environment of 10,000 Lux, the total resistance value of the micropore-processed regions was greater than Rs the photoelectric conversion element had, Rs increased, and the fill factor (FF) decreased to decrease Pmax.

Comparative Examples 104 and 105

Photoelectric conversion elements were produced and evaluated in the same manner as in Example 101, except that the micropore processing was changed to the micropore processing of Production Example 101 in Comparative Example 104 and to the micropore processing of Production Example 117 In Comparative Example 105. The results are presented in Tables 3-1 to 3-3.

When the opening area ratio was 11.0% and 90.0% in Comparative Examples 104 and 105, the total resistance value of the micropore-processed regions was greater than Rs the photoelectric conversion element had. Rs increased, and the fill factor (FF) decreased to decrease Pmax, because the contact resistance increased and the electric resistance increased due to the decrease in the cross-sectional area of the film of ITO in each of Comparative Examples 104 and 105.

Comparative Example 106

A photoelectric conversion element was produced and evaluated in the same manner as in Example 101, except that a hole-blocking layer was not formed on the output extraction terminal part and series cell-connection part and the ITO glass substrate was exposed. The results are presented in Tables 3-1 to 3-3.

When the output extraction terminal part and series cell-connection parts of the first ITO electrode were not covered with a dense hole-blocking layer as in Comparative Example 106, the resistance value of the first ITO electrode significantly increased due to the firing and the immersing in the titanium tetrachloride aqueous solution during the production of the photoelectric conversion element, thus output electricity could not be extracted from the photoelectric conversion element.

TABLE 3-1

| | Opening area ratio | | Resistance value of micropore-processed regions | Series cell (series) | Total resistance value of micropore-processed | Blocking layer thickness (nm) | Type of blocking layer | Transmittance just below power-generating layer with 500 nm (%) | ITO resistance value beofre processing ($\Omega/\square$) |
|---|---|---|---|---|---|---|---|---|---|
| Ex. 101 | 27.1% | (Production Ex. 105) | 76 | 1 | 228 | 50 | $TiO_2$ | 74.9 | 5 |
| Ex. 102 | 16.4% | (Production Ex. 103) | 667 | 1 | 2,001 | 50 | $TiO_2$ | 74.9 | 5 |
| Ex. 103 | 75.0% | (Production Ex. 112) | 536 | 1 | 1,608 | 50 | $TiO_2$ | 74.9 | 5 |
| Ex. 104 | 27.1% | (Production Ex. 115) | 76 | 6 | 608 | 50 | $TiO_2$ | 74.9 | 5 |

TABLE 3-1-continued

| | Opening area ratio | | Resistance value of micropore-processed regions | Series cell (series) | Total resistance value of micropore-processed | Blocking layer thickness (nm) | Type of blocking layer | Transmittance just below power-generating layer with 500 nm (%) | ITO resistance value beofre processing ($\Omega/\square$) |
|---|---|---|---|---|---|---|---|---|---|
| Ex. 105 | 16.4% | (Production Ex. 113) | 667 | 6 | 5,336 | 50 | $TiO_2$ | 74.9 | 5 |
| Ex. 106 | 75.0% | (Production Ex. 112) | 536 | 6 | 4,288 | 50 | $TiO_2$ | 74.9 | 5 |
| Ex. 107 | 82.4% | (Production Ex. 115) | 1,567 | 6 | 12,536 | 50 | $TiO_2$ | 74.9 | 5 |
| Ex. 108 | 27.1% | (Production Ex. 105) | 204 | 1 | 612 | 5 | $TiO_2$ | 78.9 | 5 |
| Ex. 109 | 27.1% | (Production Ex. 105) | 106 | 1 | 318 | 300 | $TiO_2$ | 71.2 | 5 |
| Ex. 110 | 27.1% | (Production Ex. 105) | 131 | 1 | 394 | 50 | $Nb_2O_5$ | 77.4 | 5 |
| Ex. 111 | 27.1% | (Production Ex. 105) | 172 | 1 | 516 | 50 | $TiO_2$ | 66.7 | 10(FTO) |
| Comp. Ex. 101 | 82.4% | (Production Ex. 115) | 1,567 | 1 | 4,701 | 50 | $TiO_2$ | 74.9 | 5 |
| Comp. Ex. 102 | 87.4% | (Production Ex. 116) | 3,405 | 1 | 10,215 | 50 | $TiO_2$ | 74.9 | 5 |
| Comp. Ex. 103 | 87.4% | (Production Ex. 106) | 3,405 | 6 | 27,240 | 50 | $TiO_2$ | 74.9 | 5 |
| Comp. Ex. 104 | 11.0% | (Production Ex. 101) | 6,864 | 1 | 20,592 | 50 | $TiO_2$ | 74.9 | 5 |
| Comp. Ex. 105 | 90.0% | (Production Ex. 117) | 8,337 | 1 | 25,011 | 50 | $TiO_2$ | 74.9 | 5 |
| Comp. Ex. 106 | 0.0% | — | 27,715 | 1 | 83,145 | 0 | None | 79.5 | 5 |

TABLE 3-2

| | 200 Lux | | | | |
|---|---|---|---|---|---|
| | Isc (μA) | Voc (V) | Pmax (μW) | FF | Rs (Ω) |
| Ex. 101 | 3.0 | 0.79 | 1.73 | 0.74 | 3.58.E+03 |
| Ex. 102 | 3.0 | 0.81 | 1.75 | 0.73 | 3.67.E+03 |
| Ex. 103 | 2.9 | 0.80 | 1.69 | 0.73 | 3.61.E+03 |
| Ex. 104 | 2.9 | 5.06 | 10.59 | 0.73 | 4.57.E+04 |
| Ex. 105 | 2.9 | 5.02 | 10.30 | 0.71 | 4.56.E+04 |
| Ex. 106 | 2.6 | 5.05 | 9.59 | 0.74 | 4.61.E+04 |
| Ex. 107 | 2.8 | 5.06 | 10.54 | 0.74 | 4.65.E+04 |
| Ex. 108 | 2.9 | 0.79 | 1.65 | 0.73 | 4.42.E+03 |
| Ex. 109 | 2.9 | 0.80 | 1.69 | 0.74 | 3.80.E+03 |
| Ex. 110 | 2.9 | 0.77 | 1.67 | 0.75 | 3.55.E+03 |
| Ex. 111 | 2.4 | 0.79 | 1.38 | 0.73 | 3.63.E+03 |
| Comp. Ex. 101 | 3.0 | 0.83 | 1.83 | 0.74 | 4.27.E+03 |
| Comp. Ex. 102 | 3.0 | 0.79 | 1.47 | 0.62 | 1.02.E+04 |
| Comp. Ex. 103 | 2.7 | 5.02 | 10.19 | 0.75 | 4.55.E+04 |
| Comp. Ex. 104 | 2.9 | 0.77 | 1.37 | 0.61 | 2.06.E+04 |
| Comp. Ex. 105 | 3.0 | 0.77 | 0.60 | 0.26 | 2.50.E+04 |
| Comp. Ex. 106 | Could not measure | Could not measure | Could not measure | Could not measure | Could not measure |

The symbol "E" used with the numerical value for Rs in Table 3-2 indicates "exponent" with the following numerical value as the base of 10, and indicates that the numerical value represented by the exponential with 10 as the base is multiplied by the numerical value before "E." For example, "1.0E+03" indicates "1.0 × 10³."

TABLE 3-3

| | 10,000 Lux | | | | |
|---|---|---|---|---|---|
| | Isc (μA) | Voc (V) | Pmax (μW) | FF | Rs (Ω) |
| Ex. 101 | 71.3 | 0.92 | 43.8 | 0.66 | 2.84.E+03 |
| Ex. 102 | 71.7 | 0.92 | 44.1 | 0.67 | 2.94.E+03 |
| Ex. 103 | 71.7 | 0.91 | 44.0 | 0.67 | 2.93.E+03 |
| Ex. 104 | 71.9 | 5.84 | 284.6 | 0.68 | 1.20.E+04 |
| Ex. 105 | 72.3 | 5.84 | 282.8 | 0.67 | 1.27.E+04 |
| Ex. 106 | 72.1 | 5.85 | 283.8 | 0.67 | 1.22.E+04 |
| Ex. 107 | 71.9 | 5.82 | 291.0 | 0.70 | 1.30.E+04 |
| Ex. 108 | 71.5 | 0.93 | 45.5 | 0.68 | 4.08.E+03 |
| Ex. 109 | 70.5 | 0.88 | 41.3 | 0.66 | 2.84.E+03 |
| Ex. 110 | 70.3 | 0.89 | 40.5 | 0.65 | 2.80.E+03 |
| Ex. 111 | 59.5 | 0.93 | 37.2 | 0.67 | 2.75.E+03 |
| Comp. Ex. 101 | 71.6 | 0.91 | 36.7 | 0.56 | 4.66.E+03 |
| Comp. Ex. 102 | 70.9 | 0.96 | 27.2 | 0.40 | 1.01.E+04 |
| Comp. Ex. 103 | 72.1 | 5.86 | 264.8 | 0.63 | 2.70.E+04 |
| Comp. Ex. 104 | 44.8 | 0.94 | 4.6 | 0.11 | 2.02.E+04 |
| Comp. Ex. 105 | 36.8 | 0.94 | 2.4 | 0.07 | 2.45.E+04 |
| Comp. Ex. 106 | Could not measure | Could not measure | Could not measure | Could not measure | Could not measure |

The symbol "E" used with the numerical value for Rs in Table 3-3 indicates "exponent" with the following numerical value as the base of 10, and indicates that the numerical value represented by the exponential with 10 as the base is multiplied by the numerical value before "E." For example, "1.0E+03" indicates "1.0 × 10³."

As it was made clear from the descriptions above, it was found that the present disclosure could provide a photoelectric conversion element capable of extracting, excellent output electricity having electric resistance that did not impair the photoelectric conversion properties, and realized series-cell connection because of formation of a plurality of micropores in the hole-blocking layer.

For example, embodiments of the present disclosure are as follows.

<1> A photoelectric conversion element including:
a first substrate;
a First transparent electrode disposed on the first substrate;
a hole-blocking layer disposed on the first transparent electrode;
an electron-transporting layer that is disposed on the hole-blocking layer and includes an electron-transporting semiconductor on a surface of which a photosensitizing compound is adsorbed;
a hole-transporting layer that is connected to the electron-transporting layer and includes a hole-transporting material; and
a second electrode disposed on the hole-transporting layer,
wherein the photoelectric conversion element includes an output extraction terminal part configured to extract electricity out from the photoelectric conversion element, and the output extraction terminal part is formed with a plurality of micropores piercing through the hole-blocking layer.

<2> The photoelectric conversion element according to <1>,
wherein an output extraction terminal part configured to extract electricity out from the photoelectric conversion element, and a series cell-connection part configured to connect the second electrode to the first transparent electrode are formed with a plurality of micropores piercing through the hole-blocking layer.

<3> The photoelectric conversion element according to <2>,
wherein a total resistance value of the output extraction terminal part and the series cell-connection pan is smaller than series resistance Rs of the photoelectric conversion element.

<4> The photoelectric conversion element according to <2> or <3>,
wherein a ratio between a total area of micropores in the output extraction terminal part and the series cell-connection part and an area of the output extraction terminal part and the series cell-connection part is 16.4% or greater but less than 82.4%.

<5> The photoelectric conversion element according to any one of <1> to <4>,
wherein the plurality of micropores formed in the hole-blocking layer pierce through the first transparent electrode to reach the first substrate.

<6> The photoelectric conversion element according to any one of <1> to <5>,
wherein the first transparent electrode is indium tin oxide (ITO) transparent film.

<7> The photoelectric conversion element according to any one of <1> to <6>,
wherein an average thickness of the first transparent element is 10 nm or greater but 1,000 nm or less, and an average thickness of the hole-blocking layer is 5 nm or greater but 1,000 nm or less.

<8> The photoelectric conversion element according to any one of <1> to <7>,
wherein a ratio of a total opening area of the plurality of micropores to an area of the output extraction terminal part is 5% or greater but 60% or less.

<9> The photoelectric conversion element according to <8>,
wherein openings of the plurality of micropores are circular shapes, a ratio of an average diameter of the circular micropores to an average value (an average pitch) of minimum distances between the adjacent circular micropores is 25% or greater but 85% or less, and the average pitch is 20 micrometers or greater but 90 micrometers or less.

<10> The photoelectric conversion element according to <8>,
wherein openings of the plurality of micropores are linear shapes, a ratio of an average width of the linear micropores to an average value (an average pitch) of minimum distances between the adjacent linear micropores is 15% or greater but 45% or less, and the average pitch is 40 micrometers or greater but 100 micrometers or less.

<11> The photoelectric conversion element according to any one of <1> to <10>,
wherein the photoelectric conversion element includes a conductive material film formed on at least part of the output extraction terminal part to embed a conductive material in the plurality of micropores to perform extraction of output electricity.

<12> The photoelectric conversion element according to any one of <1> to <11>,
wherein the hole-blocking layer is a metal oxide semiconductor including at least one selected from the group consisting of titanium oxide, niobium oxide, magnesium oxide, aluminium oxide, zinc oxide, tungsten oxide, and tin oxide.

<13> The photoelectric conversion element according to any one of <1> to <12>,
wherein transmittance of a region of the hole-blocking layer where the micropores are not formed and the first transparent electrode to light having a wavelength of 500 nm is 70.0% or greater.

<14> The photoelectric conversion element according to any one of <1> to <13>,
wherein the photoelectric conversion element is a dye-sensitized solar cell that includes a metal oxide semiconductor and the metal oxide semiconductor is sensitized with a dye.

<15> A solar cell module including;
a plurality of the photoelectric conversion elements according to any one of <1> to <14>, where the photoelectric conversion elements are connected in series or parallel.

The photoelectric conversion element according to any one of <1> to <14> and the solar cell module according to <15> can solve the above-described problems existing in the art and can achieve the object of the present disclosure.

REFERENCE SIGNS LIST

1: first substrate
2: first transparent electrode
3: hole-blocking layer
4: electron-transporting layer
5: photosensitizing compound
6: hole-transporting layer
7: second electrode
8, 9: output extraction terminal part
10: series cell-connection part
11, 12: lead line

The invention claimed is:
1. A photoelectric conversion element, comprising:
a first substrate;
an output extraction terminal part comprising a plurality of micropores;
a first transparent electrode disposed on the first substrate;
a hole-blocking layer disposed on the first transparent electrode;
an electron-transporting layer disposed on the hole-blocking layer;

a hole-transporting layer comprising a hole-transporting material; and a second electrode disposed on the hole-transporting layer, wherein the output extraction terminal part has an exposed area of the first transparent electrode through the plurality of micropores configured to extract electricity out from the photoelectric conversion element, wherein the plurality of micropores are formed in the hole-blocking layer, and the plurality of micropores pierce through the first transparent electrode to reach the first substrate, and wherein openings of the plurality of micropores are circular shapes, a ratio of an average diameter of the micropores to an average pitch of minimum distances between the adjacent circular micropores is 31.8% or more and 60% or less, and the average pitch is 20 μm or more and 60 μm or less, and wherein an average thickness of the first transparent electrode is 10 urn or greater but 1,000 nm or less.

2. The element of claim 1, wherein the first transparent electrode is indium tin oxide (ITO) transparent film.

3. The element of claim 1, wherein the photoelectric conversion element comprises a conductive material film formed on at least part of the output extraction terminal part to embed a conductive material in the plurality of micropores to perform extraction of output electricity.

4. The element of claim 1, wherein the hole-blocking layer is a metal oxide semiconductor comprising titanium oxide, niobium oxide, magnesium oxide, aluminum oxide, zinc oxide, tungsten oxide, and/or tin oxide.

5. The element of claim 1, wherein transmittance of a region of the hole-blocking layer where the micropores are not formed and the first transparent electrode to light having a wavelength of 500 nm is 70.0% or greater.

6. The element of claim 1, wherein the hole-blocking layer comprises tin oxide.

7. The element of claim 1, wherein the hole-blocking layer comprises titanium oxide.

8. The element of claim 1, wherein the hole-blocking layer comprises niobium oxide.

9. The element of claim 1, wherein the hole-blocking layer comprises aluminum oxide.

10. The element of claim 1, wherein the hole-blocking layer comprises zinc oxide.

11. The element of claim 1, wherein the hole-blocking layer comprises tungsten oxide.

12. The element of claim 1, wherein a ratio of a total opening area of the plurality of micropores to an area of the output extraction terminal part is 5% or greater and 60% or less.

13. The element of claim 1, further comprising:
a series cell-connection feature, configured to connect the second electrode to the first transparent electrode,
wherein the series cell-connection feature is further formed with the plurality of micropores piercing through the hole-blocking layer.

14. The element of claim 13, wherein a total resistance value of the output extraction terminal part and the series cell-connection feature is smaller than series resistance Rs of the photoelectric conversion element.

15. The element of claim 13, wherein a ratio between a total area of micropores in the output extraction terminal part and the series cell-connection feature and an area of the output extraction terminal part and the series cell-connection feature is 16.4% or greater but less than 82.4%.

16. The element of claim 1, wherein an average thickness of the hole-blocking layer is 5 nm or greater but 1,000 nm or less.

17. The element of claim 16, wherein an average thickness of the hole-blocking layer is 10 nm or greater but 30 nm or less.

18. The element of claim 16, wherein an average thickness of the hole-blocking layer is 500 nm or greater but 700 nm or less.

* * * * *